(12) United States Patent
Xiao et al.

(10) Patent No.: US 12,293,719 B2
(45) Date of Patent: May 6, 2025

(54) SHIFT REGISTER, DRIVING CIRCUIT AND DISPLAY SUBSTRATE

(71) Applicants: Chengdu BOE Optoelectronics Technology Co., Ltd., Sichuan (CN); BOE TECHNOLOGY GROUP CO., LTD., Beijing (CN)

(72) Inventors: Yunsheng Xiao, Beijing (CN); Haigang Qing, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/607,059

(22) Filed: Mar. 15, 2024

(65) Prior Publication Data
US 2024/0221668 A1   Jul. 4, 2024

Related U.S. Application Data

(62) Division of application No. 17/763,758, filed as application No. PCT/CN2021/079682 on Mar. 9, 2021, now Pat. No. 11,967,278.

(51) Int. Cl.
*G09G 3/00*  (2006.01)
*G09G 3/20*  (2006.01)
(Continued)

(52) U.S. Cl.
CPC ......... *G09G 3/3233* (2013.01); *G09G 3/3266* (2013.01); *G11C 19/28* (2013.01);
(Continued)

(58) Field of Classification Search
CPC ............. G09G 3/32; G09G 2300/0426; G09G 2310/0267–0286; G09G 2330/02; G11C 19/28
See application file for complete search history.

(56) References Cited

U.S. PATENT DOCUMENTS

2007/0008270 A1   1/2007   Mamba
2012/0182050 A1   7/2012   Yang
(Continued)

FOREIGN PATENT DOCUMENTS

CN   101783124 A   7/2010
CN   102651186 A   8/2012
(Continued)

OTHER PUBLICATIONS

European Patent Office, EP21929501.1 Extended European Search Report issued on Jun. 1, 2023.
(Continued)

*Primary Examiner* — Lin Li
(74) *Attorney, Agent, or Firm* — HOUTTEMAN LAW LLC

(57) ABSTRACT

The present disclosure provides a shift register including a first transistor, a second transistor, a third transistor, a fourth transistor, a fifth transistor, a first capacitor and an impedance transistor; the second transistor has a first electrode coupled to a second node; the third transistor has a first electrode coupled to a first power terminal and a second electrode coupled to the second node; the fifth transistor has a control electrode coupled to a third node; and the impedance transistor has a control electrode coupled to the first power terminal, a first electrode coupled to the second node, and a second electrode coupled to the third node.

5 Claims, 18 Drawing Sheets

(51) Int. Cl.
*G09G 3/32* (2016.01)
*G09G 3/3233* (2016.01)
*G09G 3/3266* (2016.01)
*G11C 19/28* (2006.01)

(52) U.S. Cl.
CPC ............ *G09G 2300/0842* (2013.01); *G09G 2310/0286* (2013.01); *G09G 2310/08* (2013.01)

(56) References Cited

U.S. PATENT DOCUMENTS

| | | |
|---|---|---|
| 2013/0027377 A1 | 1/2013 | Yang |
| 2014/0022228 A1 | 1/2014 | Bae |
| 2014/0104153 A1 | 4/2014 | Ma |
| 2015/0332652 A1 | 11/2015 | Tseng |
| 2016/0086562 A1 | 3/2016 | Tan |
| 2016/0329015 A1* | 11/2016 | Ji .................... G09G 3/32 |
| 2018/0130407 A1 | 5/2018 | Zhai |
| 2019/0073948 A1 | 3/2019 | Wang |
| 2020/0152283 A1 | 5/2020 | Qing |
| 2020/0211435 A1 | 7/2020 | Wang |
| 2020/0265877 A1 | 8/2020 | Zheng |
| 2021/0366354 A1* | 11/2021 | Li .................... G09G 3/007 |

FOREIGN PATENT DOCUMENTS

| | | | |
|---|---|---|---|
| CN | 104021769 A | 9/2014 | |
| CN | 104485086 A | 4/2015 | |
| CN | 105051826 A | 11/2015 | |
| CN | 106448540 A | 2/2017 | |
| CN | 106997755 A | 8/2017 | |
| CN | 109427277 A | 3/2019 | |
| CN | 110164352 A * | 8/2019 | ............... G09G 3/20 |
| CN | 110223636 A | 9/2019 | |
| CN | 110808012 A | 2/2020 | |
| CN | 110992871 A * | 4/2020 | ............... G09G 3/20 |
| CN | 112154497 A | 12/2020 | |
| EP | 3678124 A1 | 7/2020 | |
| KR | 20190069182 A | 6/2019 | |
| WO | WO 2015027600 A1 | 3/2015 | |
| WO | WO 2016123968 A1 | 8/2016 | |
| WO | WO 2020001200 A1 | 1/2020 | |

OTHER PUBLICATIONS

WIPO, International Search Report issued on Dec. 6, 2021.
U.S. Appl. No. 17/763,758 Requirement for Restriction issued on May 2, 2023.
U.S. Appl. No. 17/763,758 First Office Action issued on Aug. 23, 2023.
U.S. Appl. No. 17/763,758 Notice of Allowance issued on Jan. 16, 2024.
U.S. Appl. No. 17/763,758 Corrected Notice of Allowance issued on Feb. 15, 2024.

* cited by examiner

SHIFT REGISTER, DRIVING CIRCUIT AND DISPLAY SUBSTRATE

CROSS-REFERENCE TO RELATED APPLICATION

This is a divisional application of a National Phase application Ser. No. 17/763,758 entitled "SHIFT REGISTER, DRIVING CIRCUIT AND DISPLAY SUBSTRATE" filed on Mar. 25, 2022, which is filed under 35 U.S.C. 371 as a national stage of PCT/CN2021/079682 filed on Mar. 9, 2021, the content of each of which is hereby incorporated by reference in its entirety.

TECHNICAL FIELD

The present disclosure relates to the field of display, and in particular, to a shift register, a driving circuit, and a display substrate.

BACKGROUND

In the field of display technology, in order to realize accurate control of the light emitting state of a light emitting device in a pixel unit, a light emitting control sub-circuit is arranged in a pixel contained in the pixel unit. The light emitting control sub-circuit is generally arranged between the driving transistor and the light emitting device to control the on-off between the driving transistor and the light emitting device. The operation state of the light emitting control sub-circuit is controlled by a light emitting control signal provided by a light emitting control signal line, and the light emitting control signal in the light emitting control signal line is essentially a driving signal provided by a gate driving circuit in the peripheral area of the display substrate.

SUMMARY

The present disclosure provides a shift register, a driving circuit and a display substrate.

In a first aspect, an embodiment of the present disclosure provides a shift register, including:
  a first transistor having a control electrode coupled to a first clock signal line to receive a first clock signal, a first electrode coupled to a signal input terminal, and a second electrode coupled to a first node;
  a second transistor having a control electrode coupled to the first node, a first electrode coupled to a second node, and a second electrode coupled to the first clock signal line to receive the first clock signal;
  a third transistor having a control electrode coupled to the first clock signal line to receive the first clock signal, a first electrode coupled to a first power terminal, and a second electrode coupled to the second node;
  a fourth transistor having a control electrode coupled to a second clock signal line to receive a second clock signal, a first electrode coupled to a second electrode of a fifth transistor, and a second electrode coupled to the first node;
  the fifth transistor having a control electrode coupled to a third node and a first electrode coupled to a second power terminal;
  a first capacitor having a first electrode coupled to a fourth node and a second electrode coupled to the second clock signal line, the first node being coupled to the fourth node;
  an impedance transistor having a control electrode coupled to the first power terminal, a first electrode coupled to the second node, and a second electrode coupled to the third node; and
  a first output control circuit coupled to the third node, the fourth node and a first signal output terminal, and configured to output a first driving signal to the first signal output terminal in response to the control of signals at the third node and the fourth node.

In some embodiments, the shift register further includes:
  a second output control circuit coupled to at least the first signal output terminal and a second signal output terminal, and configured to output a second driving signal with a phase opposite to that of the first driving signal, to the second signal output terminal, according to the first driving signal output from the first signal output terminal.

In some embodiments, the first output control circuit includes:
  a ninth transistor having a control electrode coupled to a fifth node, a first electrode coupled to the second power terminal, and a second electrode coupled to the first signal output terminal; and
  a third capacitor having a first electrode coupled to the fifth node and a second electrode coupled to the second power terminal.

In some embodiments, the first output control circuit further includes:
  a sixth transistor having a control electrode coupled to the third node, a first electrode coupled to the second clock signal line to receive the second clock signal, and a second electrode coupled to a sixth node;
  a seventh transistor having a control electrode coupled to the second clock signal line to receive the second clock signal, a first electrode coupled to the sixth node, and a second electrode coupled to the fifth node;
  an eighth transistor having a control electrode coupled to the first node, a first electrode coupled to the fifth node, and a second electrode coupled to the second power terminal;
  a tenth transistor having a control electrode coupled to the fourth node, a first electrode coupled to the first signal output terminal, a second electrode coupled to the first power terminal, the first node being coupled to the fourth node; and
  a second capacitor having a first electrode coupled to the third node and a second electrode coupled to the sixth node.

In some embodiments, the second output control circuit includes:
  an eleventh transistor having a control electrode coupled to the fifth node, a first electrode coupled to the first power terminal, and a second electrode coupled to a seventh node;
  a twelfth transistor having a control electrode coupled to the first signal output terminal, a first electrode coupled to the seventh node, and a second electrode coupled to the second power terminal;
  a thirteenth transistor having a control electrode coupled to the seventh node, a first electrode coupled to the first clock signal line, and a second electrode coupled to a first electrode of a fourth capacitor;
  the fourth capacitor having a second electrode coupled to the seventh node;
  a fourteenth transistor having a control electrode coupled to the seventh node, a first electrode coupled to the first power terminal, and a second electrode coupled to the second signal output terminal; and a fifteenth transistor having a control electrode coupled to the first signal output terminal, a first electrode coupled to the second signal output terminal, and a second electrode coupled to the second power terminal.

In some embodiments, the second output control circuit includes:

an eleventh transistor having a control electrode coupled to the fifth node, a first electrode coupled to the first power terminal, and a second electrode coupled to a seventh node;

a twelfth transistor having a control electrode coupled to the first signal output terminal, a first electrode coupled to the seventh node, and a second electrode coupled to the second power terminal;

a thirteenth transistor having a control electrode coupled to the seventh node, a first electrode coupled to the second clock signal line, and a second electrode coupled to a first electrode of a fourth capacitor;

the fourth capacitor having a second electrode coupled to the seventh node;

a fourteenth transistor having a control electrode coupled to the seventh node, a first electrode coupled to the first power terminal, and a second electrode coupled to the second signal output terminal; and a fifteenth transistor having a control electrode coupled to the first signal output terminal, a first electrode coupled to the second signal output terminal, and a second electrode coupled to the second power terminal.

In some embodiments, the second output control circuit includes:

an eleventh transistor having a control electrode coupled to the fifth node, a first electrode coupled to the first power terminal, and a second electrode coupled to a seventh node;

a twelfth transistor having a control electrode coupled to the first signal output terminal, a first electrode coupled to the seventh node, and a second electrode coupled to the second power terminal;

a fourth capacitor having a first electrode coupled to the first clock signal line or the second clock signal line, and a second electrode coupled to the seventh node;

a fourteenth transistor having a control electrode coupled to the seventh node, a first electrode coupled to the first power terminal, and a second electrode coupled to the second signal output terminal; and a fifteenth transistor having a control electrode coupled to the first signal output terminal, a first electrode coupled to the second signal output terminal, and a second electrode coupled to the second power terminal.

In some embodiments, the second output control circuit includes:

an eleventh transistor having a control electrode coupled to the fifth node, a first electrode coupled to the first power terminal, and a second electrode coupled to a seventh node;

a twelfth transistor having a control electrode coupled to the first signal output terminal, a first electrode coupled to the seventh node, and a second electrode coupled to the second power terminal;

a fourth capacitor having a first electrode coupled to the second clock signal line and a second electrode coupled to the seventh node;

a fourteenth transistor having a control electrode coupled to the seventh node, a first electrode coupled to the first power terminal, and a second electrode coupled to the second signal output terminal; and a fifteenth transistor having a control electrode coupled to the first signal output terminal, a first electrode coupled to the second signal output terminal, and a second electrode coupled to the second power terminal.

In some embodiments, the shift register further includes:

a voltage limiting transistor through which the first node is coupled to the fourth node;

wherein the voltage limiting transistor has a control electrode coupled to the first power terminal, a first electrode coupled to the first node, and a second electrode coupled to the fourth node.

In a second aspect, an embodiment of the present disclosure further provide a driving circuit, including a plurality of shift registers arranged in cascade, wherein the shift registers each adopt the shift register provided by the above first aspect;

the signal input terminal of the shift register of a first stage is coupled to a frame start signal terminal; and the signal input terminal of each of the plurality of shift registers, except the shift register at the first stage, is coupled to the first signal output terminal of the shift register of a previous one stage.

In a third aspect, an embodiment of the present disclosure further provides a display substrate, including a display area and a peripheral area surrounding the display area, wherein a plurality of pixel units are in the display area, each of the plurality of pixel units is configured with a corresponding light emitting control signal line, a light emitting control driving circuit is in the peripheral area, the light emitting control driving circuit adopts the driving circuit according to the above second aspect, and the first signal output terminal of the shift register of each stage in the light emitting control driving circuit is coupled to the corresponding light emitting control signal line in the display area.

In some embodiments, each of the plurality of pixel units is further provided with a corresponding reset signal line; and a second output control circuit is arranged in the shift register in the light emitting control driving circuit, and the second signal output terminal of the shift register in the light emitting control driving circuit is coupled to the corresponding reset signal line in the display area.

In some embodiments, the pixel unit includes a pixel circuit and a light emitting device, the pixel circuit including: a first reset sub-circuit, a second reset sub-circuit, a data writing sub-circuit, a threshold compensation sub-circuit, a light emitting control sub-circuit, and a driving transistor;

the first reset sub-circuit is coupled to an initialization voltage terminal, a control electrode of the driving transistor and a corresponding scanning control signal line, and is configured to write an initialization voltage provided by the initialization voltage terminal to the control electrode of the driving transistor in response to the control of a scanning control signal provided by the scanning control signal line;

the second reset sub-circuit is coupled to the initialization voltage terminal, a first terminal of the light emitting device and a corresponding reset signal line, and is configured to write the initialization voltage to the first terminal of the light emitting device in response to the control of the reset signal line;

the data writing sub-circuit is coupled to a first electrode of the driving transistor, a corresponding data line and a corresponding scanning signal line, and is configured to write a data voltage provided by the data line to the first electrode of the driving transistor in response to the control of the scanning signal line;

the threshold compensation sub-circuit is coupled to a second operating voltage terminal, the control electrode of the driving transistor, the first electrode of the driving transistor, a second electrode of the driving transistor and the corresponding scanning signal line, and is configured to write a data compensation voltage, which is equal to a sum of the data voltage and a threshold voltage of the driving transistor, to the control electrode of the driving transistor in response to the control of the scanning signal line;

the light emitting control sub-circuit is between the second electrode of the driving transistor and the first terminal of the light emitting device, is coupled to the light emitting control signal line, and is configured to enable a conduction between the second electrode of the driving transistor and the first terminal of the light emitting device in response to the control of the light emitting control signal provided by the light emitting control signal line;

the driving transistor is configured to output a corresponding driving current in response to the control of the data compensation voltage; and a second terminal of the light emitting device is coupled to a first operating voltage terminal.

In some embodiments, the first reset sub-circuit includes a twenty-first transistor, the second reset sub-circuit includes a twenty-second transistor, the data writing sub-circuit includes a twenty-third transistor, the threshold compensation sub-circuit includes a twenty-fourth transistor, a twenty-fifth transistor, and a storage capacitor, the light emitting control sub-circuit includes a twenty-sixth transistor;

the twenty-first transistor has a control electrode coupled to the scanning control signal line, a first electrode coupled to the initialization voltage terminal, and a second electrode coupled to the control electrode of the driving transistor;

the twenty-second transistor has a control electrode coupled to the reset signal line, a first electrode coupled to the initialization voltage terminal, and a second electrode coupled to the first terminal of the light emitting device;

the twenty-third transistor has a control electrode coupled to the scanning signal line, a first electrode coupled to the data line, and a second electrode coupled to the first electrode of the driving transistor;

the twenty-fourth transistor has a control electrode coupled to the light emitting control signal line, a first electrode coupled to the second operating voltage terminal, and a second electrode coupled to the first electrode of the driving transistor;

the twenty-fifth transistor has a control electrode coupled to the scanning signal line, a first electrode coupled to the control electrode of the driving transistor, and a second electrode coupled to the second electrode of the driving transistor;

the storage capacitor has a first terminal coupled to the second operating voltage terminal and a second terminal coupled to the control electrode of the driving transistor; and the twenty-sixth transistor has a control electrode coupled to the light emitting control signal line, a first electrode coupled to the second electrode of the driving transistor, and a second electrode coupled to the first terminal of the light emitting device.

In some embodiments, for any pixel unit in each of rows except a first row, the scanning control signal line coupled to the pixel unit is the scanning signal line configured for a pixel unit in a previous one row.

In some embodiments, each of the plurality of pixel units is provided with a corresponding scanning signal line, and a scan driving circuit is disposed in the peripheral area; and the signal output terminal of the shift register of each stage in the light emitting control driving circuit is coupled to the corresponding scanning signal line in the display area.

DETAIL DESCRIPTION OF EMBODIMENTS

Figure 1:
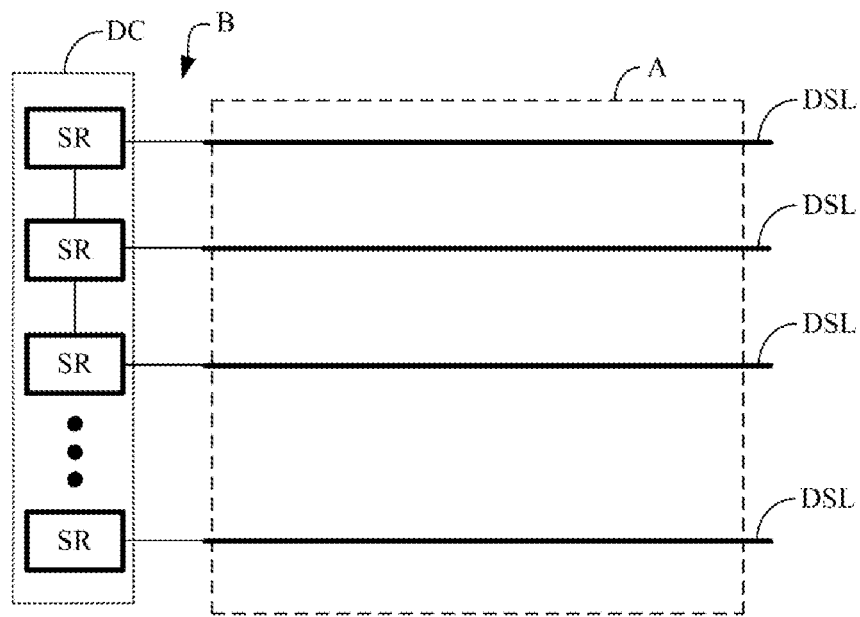
FIG. 1 is a schematic diagram of a structure of a display substrate according to an embodiment of the present disclosure.

In order to make one of ordinary skill in the art better understand the technical solution of the present disclosure, a shift register, a display substrate and a display device provided in the present disclosure are described in detail below with reference to the accompanying drawings.

Example embodiments will be described more fully hereinafter with reference to the accompanying drawings, and may be embodied in different forms and should not be construed as limited to the embodiments set forth herein. Rather, these embodiments are provided so that this disclosure will be thorough and complete, and will fully convey the scope of the present disclosure to one of ordinary skill in the art.

The term used herein is for the purpose of describing particular embodiments only and is not intended to limit the present disclosure. As used herein, the singular forms "a", "an" and "the" are intended to include the plural forms as well, unless the context clearly indicates otherwise. It will be further understood that the term "comprises" or "comprising", when used in this specification, may specify the presence of stated features, integers, steps, operations, elements, and/or components, but do not preclude the presence or addition of one or more other features, integers, steps, operations, elements, components, and/or groups thereof.

It will be understood that, although the terms "first", "second", etc. may be used herein to describe various elements, instructions or requests, these elements, instructions, or requests should not be limited by these terms. These terms are only used to distinguish one element, instruction or request from another element, instruction or request.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

It should be noted that the transistor used in the embodiments of the present disclosure may be a thin film transistor or a field effect transistor or any other device with the same and similar characteristics, and since the source and the drain of the transistor used are symmetrical to each other, there is no difference between the source and the drain. In the embodiments of the present disclosure, the control electrode of the transistor refers to the gate of the transistor; to distinguish the source and the drain of the transistor from each other, one of the source and the drain is called a first electrode, the other is called a second electrode, and the gate is called a control electrode. In addition, the transistor may be an N-type transistor or a P-type transistor according to the characteristics of the transistor, and in the following embodiments, the P-type transistor is used for explanation. When a P-type transistor is used, the first electrode is the drain of the P-type transistor, the second electrode is the source of the P-type transistor, and the N-type transistor belongs to the opposite case. It should be understood that how to implement the following embodiments using N-type transistors will be easily contemplated by one of ordinary skill in the art without inventive effort, and therefore is within the scope of the embodiments of the present disclosure.

An "active level" in this disclosure refers to a level that can control a corresponding transistor to be turned on; specifically, for a P-type transistor, the corresponding active level is a low level; for an N-type transistor, the corresponding active level is a high level.

In the case of using a P-type transistor, a power voltage provided by a first power terminal is a low level voltage VGL (generally, VGL is lower than 0V), and a power voltage provided by a second power terminal is a high level voltage VGH (generally, VGH is greater than 0V).

FIG. 1 is a schematic diagram of a structure of a display substrate according to an embodiment of the present disclosure. As shown in FIG. 1, the display substrate includes a display area A and a non-display area B surrounding the display area A. A plurality of pixel units are arranged in the display area A in an array, a pixel circuit and a light emitting device are arranged in the pixel unit. Each pixel circuit is configured with a plurality of corresponding driving signal lines DSL, such as a scanning signal line (also referred to as a gate line), a light emitting control signal line, a reset signal line, and the like, and the driving signal lines DSL are used for controlling the pixel circuits to operate. A plurality of driving circuits DC (only one driving circuit is exemplarily shown in the drawing) for providing driving signals to the various types of driving signal lines are disposed in the non-display area, wherein the driving circuit DC includes a plurality of shift registers SR connected in cascade, and a signal output terminal of each shift register SR is connected to a corresponding driving signal line DSL to output a corresponding driving signal to the corresponding driving signal line DSL.

In practical applications, it is found that the operation state of the shift register in the conventional gate driving circuit is unstable, and the problem of abnormal output is prone to occur, thereby causing abnormal display of the pixel unit. In view of the above technical problems, embodiments of the present disclosure provide corresponding solutions.

Figure 2:
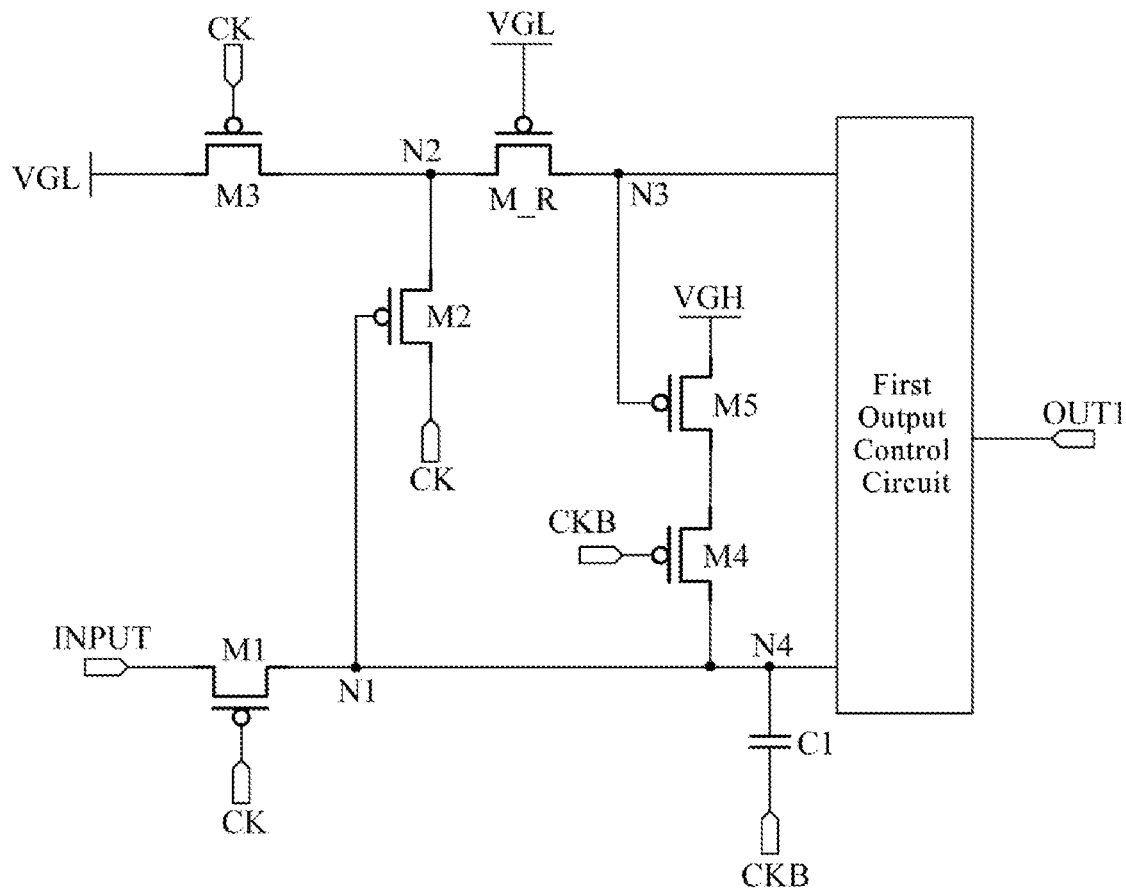
FIG. 2 is a schematic diagram of a circuit structure of a shift register according to an embodiment of the present disclosure.

FIG. 2 is a schematic diagram of a circuit structure of a shift register according to an embodiment of the present disclosure. As shown in FIG. 2, the shift register according to the embodiment of the present disclosure includes a first transistor M1, a second transistor M2, a third transistor M3, a fourth transistor M4, a fifth transistor M5, an impedance transistor M_R, a first capacitor C1, and a first output control circuit 1.

A control electrode of the first transistor M1 is coupled to a first clock signal line CK to receive a first clock signal, a first electrode of the first transistor M1 is coupled to a signal input terminal INPUT, and a second electrode of the first transistor M1 is coupled to a first node N1.

A control electrode of the second transistor M2 is coupled to the first node N1, a first electrode of the second transistor M2 is coupled to a second node N2, and a second electrode of the second transistor M2 is coupled to the first clock signal line CK to receive the first clock signal.

A control electrode of the third transistor M3 is coupled to the first clock signal line CK to receive the first clock signal, a first electrode of the third transistor M3 is coupled to a first power terminal, and a second electrode of the third transistor M3 is coupled to the second node N2.

A control electrode of the fourth transistor M4 is coupled to a second clock signal line CKB to receive a second clock signal, a first electrode of the fourth transistor M4 is coupled to a second electrode of the fifth transistor M5, and a second electrode of the fourth transistor M4 is coupled to the first node N1.

A control electrode of the fifth transistor M5 is coupled to a third node N3, and a first electrode of the fifth transistor M5 is coupled to a second power terminal.

A first electrode of the first capacitor C1 is coupled to a fourth node N4, a second electrode of the first capacitor C1 is coupled to the second clock signal line CKB, and the first node N1 is coupled to the fourth node N4.

A control electrode of the impedance transistor M_R is coupled to the first power terminal, a first electrode of the impedance transistor M_R is coupled to the second node N2, and a second electrode of the impedance transistor M_R is coupled to the third node N3.

The first output control circuit 1 is coupled to the third node N3, the fourth node N4 and a first signal output terminal OUT1, and the first output control circuit 1 is configured to output a first driving signal to the first signal output terminal OUT1 in response to the control of the signals at the third node N3 and the fourth node N4.

It should be noted that "coupled" in this disclosure means "electrically connected between two or more structures", which is not limited to direct connection.

During the operation process of the shift register, when the second clock signal in the second clock signal line CKB is switched from a high level state to a low level state, the voltages at the fourth node N4 and the first node N1 are pulled down in an extremely short time. At this time, the second transistor M2 has a risk of being turned on by mistake due to the first node N1 being pulled down. During the period when the second transistor M2 is turned on by mistake, the first clock signal in a high level state may mistakenly charge the second node N2 and the third node N3 through the second transistor M2, so that the voltage at the third node N3 is abnormally pulled up, and both the fourth transistor M4 and the first output control circuit connected to the third node N3 are abnormally operated, thereby affecting the normal operation of the shift register. With the increase of product service time, the threshold voltage of the second transistor M2 drifts, and the risk of the second transistor M2 being turned on by mistake is greater.

In the embodiment of the present disclosure, to overcome the above technical problem, the impedance transistor M_R is disposed between the second node N2 and the third node N3, the control electrode of the impedance transistor M_R is connected to the first power terminal, and the impedance transistor M_R is in a constantly turned-on state. The impedance transistor M_R in a turned-on state may block, to a certain extent, a current existing between the second node N2 and the third node N3. That is, the impedance transistor M_R may generate an impedance action, so as to reduce the pull-up effect of the first clock signal on the voltage at the third node N3 when the second transistor M2 is turned on by mistake, which is beneficial to maintaining the stability of the level state at the third node N3, so that the third node N3 can be always in a low level state during the second transistor M2 is turned on by mistake.

Figure 3:
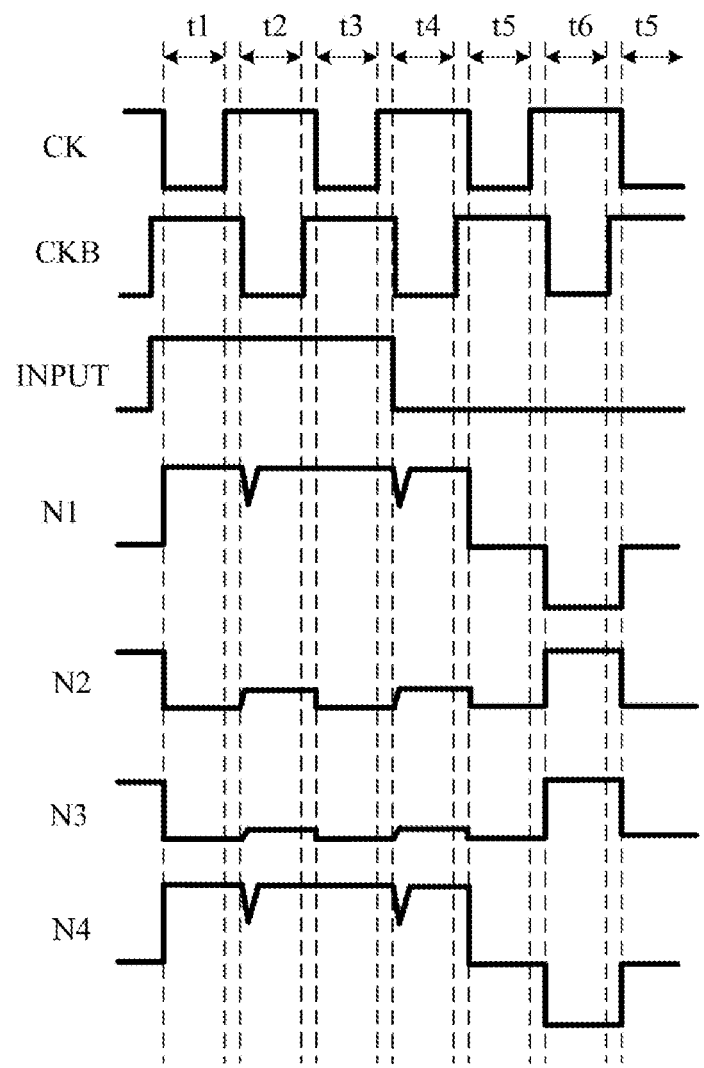
FIG. 3 is a timing diagram illustrating an operation of the shift register shown in FIG. 2.

The following is a detailed description with specific timing. FIG. 3 is a timing diagram illustrating an operation of the shift register shown in FIG. 2. As shown in FIG. 3, only the operation states of the first transistor M1 to the fifth transistor M5 will be described in detail in the following description, and a specific operation process of the first output control circuit 1 will be described later with reference to a specific example, and the operation process of the shift register includes the following phases:

In a first phase t1, the first clock signal provided by the first clock signal line CK is in a low level state, the second clock signal provided by the second clock signal line CKB is in a high level state, and the signal provided by the signal input terminal INPUT is in a high level state.

Specifically, the first clock signal is in a low level state, and both the first transistor M1 and the third transistor M3 are turned on; the second clock signal is in a high level state, and the fourth transistor M4 is turned off.

The signal input terminal INPUT provides a signal in a high level state, and the signal is written into the first node N1 through the first transistor M1, the first node N1 is in a high level state, and the second transistor M2 is in a turned-off state. Meanwhile, the second node N2 is discharged through the third transistor M3, and the second node N2 is in a low level state (the voltage is slightly higher than VGL). The gate-source voltage of the impedance transistor M_R is a negative value, the impedance transistor M_R is in a turned-on state, the third node N3 is discharged through the second node N2, and the third node N3 is in a low level state (the voltage is slightly higher than the voltage at the second node N2). Since the third node N3 is in a low level state, the fifth transistor M5 is turned on.

At the end of the first phase t1, the first node N1 is in a high level state, the second node N2 is in a low level state, the third node N3 is in a low level state, and the fourth node N4 is in a high level state.

In a second phase t2, the first clock signal provided by the first clock signal line CK is in a high level state, the second clock signal provided by the second clock signal line CKB is in a low level state, and the signal provided by the signal input terminal INPUT is in a high level state.

Specifically, the first clock signal is in a high level state, and both the first transistor M1 and the third transistor M3 are turned off; the second clock signal is in a low level state, and the fourth transistor M4 is turned on.

Without considering the influence of the first output control circuit 1 on the voltage at the third node N3, since the third transistor M3 is turned off, the third node N3 is in a floating state to maintain a low level state in the first phase t1.

It should be noted that, at the initial moment of the second phase t2, the second clock signal is switched from a high level to a low level, and under the bootstrap action of the first capacitor C1, the voltage at the fourth node N4 and the first node N1 is pulled down. At this time, the second transistor M2 has a risk of being turned on by mistake. In the present application, even if the second transistor M2 is turned on by mistake for a short time, since the impedance transistor M_R is disposed between the second node N2 and the third node N3, the first clock signal in a high level state has a very small influence on the voltage at the third node N3, the level at the third node N3 may be always maintained in a low level state, and the fifth transistor M5 is maintained to be turned on.

Since both the fourth transistor M4 and the fifth transistor M5 are turned on, the voltage at the first node N1 and the fourth node N4 is charged by the high level voltage VGH through the fifth transistor M5 and the fourth transistor M4, so that the first node N1 and the fourth node N4 are in a high level state, and the second transistor M2 in a turned-on state by mistake is also immediately switched to a turned-off state.

At the end of the second phase t2, the first node N1 is in a high level state, the second node N2 is in a low level state, the third node N3 is in a low level state, and the fourth node N4 is in a high level state.

In a third phase t3, the first clock signal provided by the first clock signal line CK is in a low level state, the second clock signal provided by the second clock signal line CKB is in a high level state, and the signal provided by the signal input terminal INPUT is in a high level state.

The operation processes of the first transistor M1 to the fifth transistor M5 in the third phase t3 are the same as the operation processes in the first phase t1, and specific reference may be made to the corresponding description of the first phase t1.

In a fourth phase t4, the first clock signal provided by the first clock signal line CK is in a high level state, the second clock signal provided by the second clock signal line CKB is in a low level state, and the signal provided by the signal input terminal INPUT is in a low level state.

The operation processes of the first transistor M1 to the fifth transistor M5 in the fourth phase t4 are the same as the operation processes in the second phase t2, and specific reference may be made to the corresponding description of the second phase t2.

In a fifth phase t5, the first clock signal provided by the first clock signal line CK is in a low level state, the second clock signal provided by the second clock signal line CKB is in a high level state, and the signal provided by the signal input terminal INPUT is in a low level state.

Specifically, the first clock signal is in a low level state, and both the first transistor M1 and the third transistor M3 are turned on; the second clock signal is in a high level state, and the fourth transistor M4 is turned off.

The signal input terminal INPUT provides a signal in a low level state, and the signal is written into a first node N1 through the first transistor M1, the first node N1 is in a low level state, the second transistor M2 is in a turned-on state, the second node N2 is discharged through the second transistor M2 and the third transistor M3, and the second node N2 is in a low level state. The gate-source voltage of the impedance transistor M_R is a negative value, the impedance transistor M_R is in a turned-on state, the third node N3 is discharged through the second node N2, and the third node N3 is in a low level state. Since the third node N3 is in a low level state, the fifth transistor M5 is turned on.

At the end of the fifth phase t5, the first node N1 is in a low level state, the second node N2 is in a low level state, the third node N3 is in a low level state, and the fourth node N4 is in a low level state.

In a sixth phase t6, the first clock signal provided by the first clock signal line CK is in a high level state, the second clock signal provided by the second clock signal line CKB is in a low level state, and the signal provided by the signal input terminal INPUT is in a low level state.

Specifically, the first clock signal is in a high level state, and both the first transistor M1 and the third transistor M3 are turned off; the second clock signal is in a low level state and the fourth transistor M4 is turned on.

The second clock signal is switched from a high level to a low level, the voltage at the fourth node N4 is pulled down from being approximately equal to VGL to being approximately equal to 2VGL under the bootstrap action of the first capacitor C1, and both the first node N1 and the fourth node N4 are in a low level state. The second transistor M2 is in a turned-on state (the second transistor M2 is normally turned on), the first clock signal in a high level state charges the second node N2 through the second transistor M2, the second node N2 and the third node N3 are in a high level state, and the fifth transistor M5 is turned off.

At the end of the sixth phase t6, the first node N1 is in a low level state, the second node N2 is in a high level state, the third node N3 is in a high level state, and the fourth node N4 is in a low level state.

In the subsequent process, the shift register repeats performing the above-described fifth phase t5 and sixth phase t6 in sequence until the start of the next period.

Based on the above, it can be seen that in the processes of the second phase t2 and the fourth phase t4, the technical solution of the present disclosure can avoid the problem that the third node N3 is abnormally pulled up to a high level state due to the second transistor M2 being turned-on by mistake, so that the third node N3 can be ensured to be always in a low level state in the processes of the second phase t2 and the fourth phase t4, and further the normal operation of the shift register is ensured.

Figure 4:
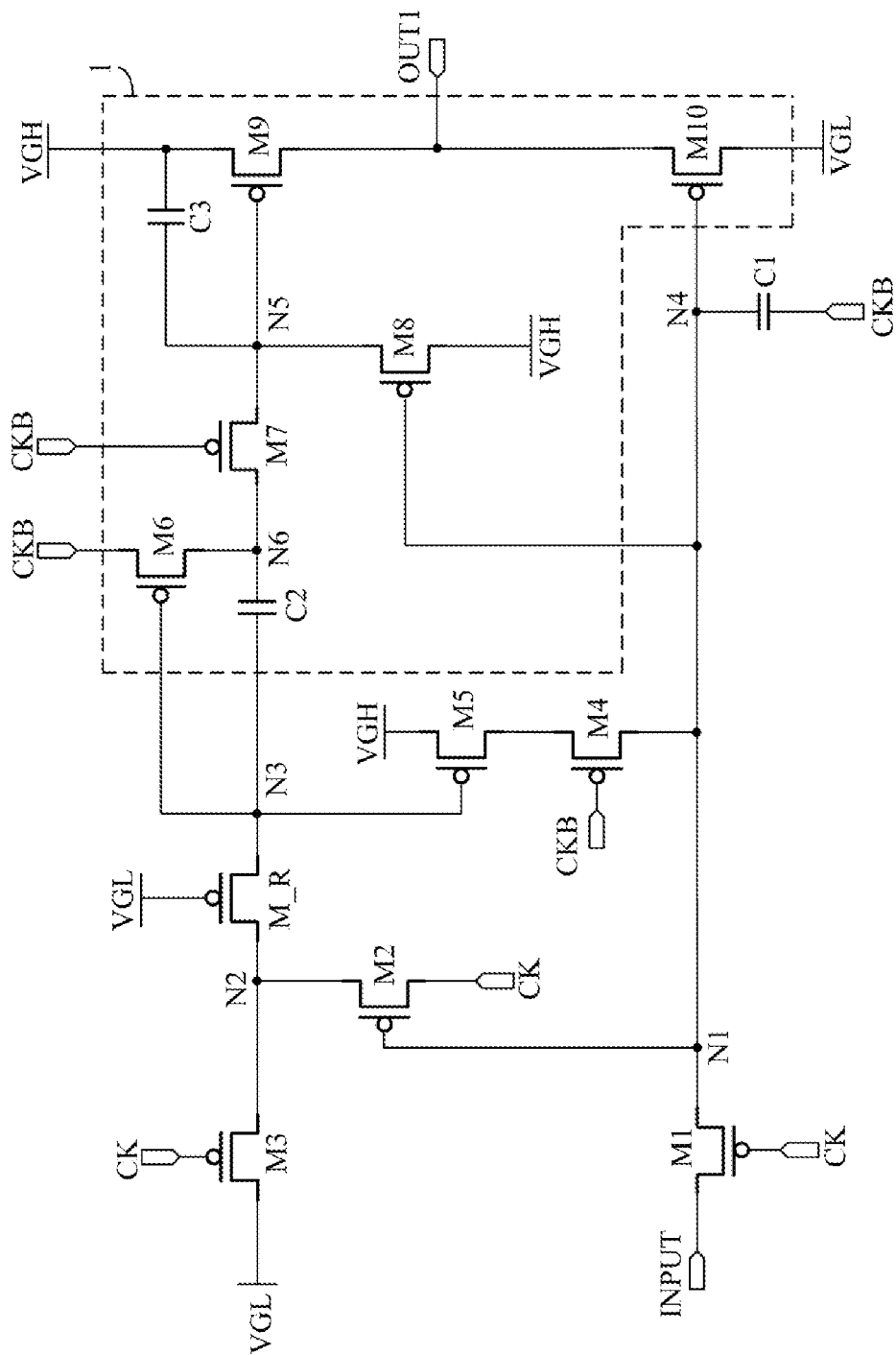
FIG. 4 is a schematic diagram of a circuit structure of another shift register according to an embodiment of the present disclosure.

FIG. 4 is a schematic diagram of a circuit structure of another shift register according to an embodiment of the present disclosure. As shown in FIG. 4, the shift register shown in FIG. 4 is a specific alternative embodiment based on the shift register shown in FIG. 2; the first output control circuit 1 includes a ninth transistor M9 and a third capacitor C3.

A control electrode of the ninth transistor M9 is coupled to a fifth node N5, a first electrode of the ninth transistor M9 is coupled to the second power terminal, and a second electrode of the ninth transistor M9 is coupled to the first signal output terminal OUT1; a first electrode of the third capacitor C3 is coupled to the fifth node N5, and a second electrode of the third capacitor C3 is coupled to the second power terminal.

In some embodiments, the first output control circuit 1 further includes a sixth transistor M6, a seventh transistor M7, an eighth transistor M8, a tenth transistor M10, and a second capacitor C2.

A control electrode of the sixth transistor M6 is coupled to the third node N3, a first electrode of the sixth transistor M6 is coupled to the second clock signal line CKB to receive the second clock signal, and a second electrode of the sixth transistor M6 is coupled to a sixth node N6. A control electrode of the seventh transistor M7 is coupled to the second clock signal line CKB to receive the second clock signal, a first electrode of the seventh transistor M7 is coupled to the sixth node N6, and a second electrode of the seventh transistor M7 is coupled to the fifth node N5. A control electrode of the eighth transistor M8 is coupled to the first node N1, a first electrode of the eighth transistor M8 is coupled to the fifth node N5, and a second electrode of the eighth transistor M8 is coupled to the second power terminal. A control electrode of the tenth transistor M10 is coupled to the fourth node N4, a first electrode of the tenth transistor M10 is coupled to the first signal output terminal OUT1, a second electrode of the tenth transistor M10 is coupled to the first power terminal, and the first node N1 is coupled to the fourth node N4. A first electrode of the second capacitor C2 is coupled to the third node N3, and a second electrode of the second capacitor C2 is coupled to the sixth node N6.

Figure 5:
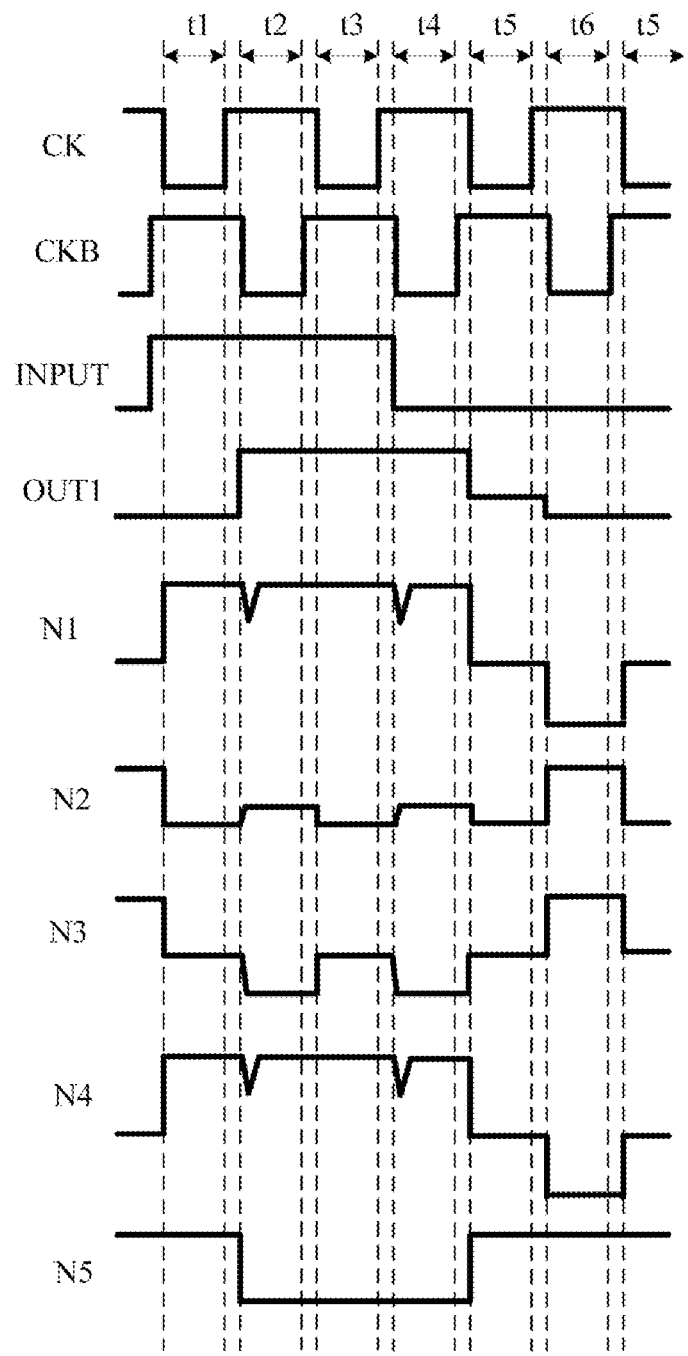
FIG. 5 is a timing diagram illustrating an operation of the shift register shown in FIG. 4.

FIG. 5 is a timing diagram illustrating an operation of the shift register shown in FIG. 4. As shown in FIG. 5, the level states of the first clock signal provided by the first clock signal line CK, the second clock signal provided by the second clock signal line CKB, and the signal provided by the signal input terminal INPUT in each phase, and the operation states of the first transistor M1 to the fifth transistor M5 in each phase may refer to the corresponding description of FIGS. 2 and 3, which are not repeated herein, and only the detailed operation process of the first output control circuit 1 is described in detail below.

In a first phase t1, the first clock signal provided by the first clock signal line CK is in a low level state, the second clock signal provided by the second clock signal line CKB is in a high level state, the first node N1 is in a high level state, the second node N2 is in a low level state, the third node N3 is in a low level state, and the fourth node N4 is in a high level state.

Specifically, the second clock signal is in a high level state, and the seventh transistor M7 is turned off. Since the third node N3 is in a low level state, the sixth transistor M6 is turned on, the second clock signal in a high level state is written to the sixth node N6 through the sixth transistor M6, and the sixth node N6 is in a high level state. Meanwhile, since both the first node N1 and the fourth node N4 are in a high level state, both the eighth transistor M8 and the tenth transistor M10 are turned off.

Since both the seventh transistor M7 and the eighth transistor M8 are turned off, the fifth node N5 is in a floating state, the fifth node N5 maintains a high level state of a previous phase (a last phase of a previous period), and the ninth transistor M9 is turned off.

Since both the ninth transistor M9 and the tenth transistor M10 are turned off, the first signal output terminal OUT1 is in a floating state, and the first signal output terminal OUT1 maintains a low level state of a previous phase (a last phase of a previous period), that is, the first signal output terminal OUT1 outputs a low level signal.

In a second phase t2, the first clock signal provided by the first clock signal line CK is in a high level state, the second clock signal provided by the second clock signal line CKB is in a low level state, the first node N1 is in a high level state, the second node N2 is in a low level state, the third node N3 is in a low level state, and the fourth node N4 is in a high level state.

Specifically, the second clock signal is in a low level state, and the seventh transistor M7 is turned on. Since the third node N3 is in a low level state, the sixth transistor M6 is turned on, the second clock signal in a low level state is written to the sixth node N6 through the sixth transistor M6, and the sixth node N6 is in a low level state. Since the voltage at the sixth node N6 is switched from a high level state to a low level state, the voltage at the third node N3 is pulled down to a lower level under the bootstrap action of the second capacitor C2. It should be noted that, even if the second transistor M2 is turned on by mistake at this time and the first clock signal in a high level state pulls up the second node N2 and the third node N3, due to the existence of the impedance transistor M_R and a dominant role of the pull-down effect of the second capacitor C2 on the third node N3, the voltage at the third node N3 tends to be pulled down as a whole, so as to further ensure that the third node N3 is always in a low level state during the second phase t2. During the process that the second capacitor C2 pulls down the voltage at the third node N3, the voltage at the third node N3 is pulled down from being approximately equal to VGL to being approximately equal to 2VGL. At this time, the gate-source voltage of the impedance transistor M_R is greater than the threshold voltage of the impedance transistor M_R, and the impedance transistor M_R is switched from a turned-on state to a turned-off state.

Since the sixth transistor M6 and the seventh transistor M7 are turned on, the second clock signal in a low level state is written to the fifth node N5 through the sixth transistor M6 and the seventh transistor M7, and the fifth node N5 is in a low level state. Meanwhile, since both the first node N1 and the fourth node N4 are in a high level state, both the eighth transistor M8 and the tenth transistor M10 are turned off.

Since the ninth transistor M9 is in a turned-on state and the tenth transistor M10 is in a turned-off state, the high level voltage VGH is written to the first signal output terminal OUT1 through the ninth transistor M9, and the first signal output terminal OUT1 outputs a high level signal.

In a third phase t3, the first clock signal provided by the first clock signal line CK is in a low level state, the second clock signal provided by the second clock signal line CKB is in a high level state, the first node N1 is in a high level state, the second node N2 is in a low level state, the third node N3 is in a low level state, and the fourth node N4 is in a high level state.

Specifically, the second clock signal is in a high level state, and the seventh transistor M7 is turned off. Since the third node N3 is in a low level state, the sixth transistor M6 is turned on, the second clock signal in a high level state is written to the sixth node N6 through the sixth transistor M6, and the sixth node N6 is in a high level state. Since the third transistor M3 is turned on, the low level voltage VGL is written to the third node N3 through the third transistor M3 and the impedance transistor M_R, and the third node N3 is still in a low level state and the voltage is approximately equal to VGL. Meanwhile, since both the first node N1 and the fourth node N4 are in a high level state, both the eighth transistor M8 and the tenth transistor M10 are turned off.

Since both the seventh transistor M7 and the eighth transistor M8 are turned off, the fifth node N5 is in a floating state, the fifth node N5 maintains a low level state of the previous phase (the second phase t2), and the ninth transistor M9 maintains being turned-on.

Since the ninth transistor M9 is in a turned-on state and the tenth transistor M10 is in a turned-off state, the high level voltage VGH is written to the first signal output terminal OUT1 through the ninth transistor M9, and the first signal output terminal OUT1 maintains outputting a high level signal.

In a fourth phase t4, the first clock signal provided by the first clock signal line CK is in a high level state, the second clock signal provided by the second clock signal line CKB is in a low level state, the first node N1 is in a high level state, the second node N2 is in a low level state, the third node N3 is in a low level state, and the fourth node N4 is in a high level state.

Specifically, the second clock signal is in a low level state, and the seventh transistor M7 is turned on. Since the third node N3 is in a low level state, the sixth transistor M6 is turned on, the second clock signal in a low level state is written to the sixth node N6 through the sixth transistor M6, and the sixth node N6 is in a low level state. Since the voltage at the sixth node N6 is switched from a high level state to a low level state, the voltage at the third node N3 is pulled down to a lower level under the bootstrap action of the second capacitor C2. It should be noted that, even if the second transistor M2 is turned on by mistake at this time and the first clock signal in a high level state pulls up the third node N3, due to the existence of the impedance transistor M_R and a dominant role of the pull-down effect of the second capacitor C2 on the third node N3, the voltage at the third node N3 tends to be pulled down as a whole, so as to further ensure that the third node N3 is always in a low level state during the fourth phase t4. During the process that the second capacitor C2 pulls down the voltage at the third node N3, the voltage at the third node N3 is pulled down from being approximately equal to VGL to being approximately equal to 2VGL.

Since the sixth transistor M6 and the seventh transistor M7 are turned on, the second clock signal in a low level state is written to the fifth node N5 through the sixth transistor M6 and the seventh transistor M7, and the fifth node N5 is in a low level state. Meanwhile, since both the first node N1 and the fourth node N4 are in a high level state, both the eighth transistor M8 and the tenth transistor M10 are turned off.

Since the ninth transistor M9 is in a turned-on state and the tenth transistor M10 is in a turned-off state, the high level voltage VGH is written to the first signal output terminal OUT1 through the ninth transistor M9, and the first signal output terminal OUT1 outputs a high level signal.

In a fifth phase t5, the first clock signal provided by the first clock signal line CK is in a low level state, the second clock signal provided by the second clock signal line CKB is in a high level state, the first node N1 is in a low level state, the second node N2 is in a low level state, the third node N3 is in a low level state, and the fourth node N4 is in a low level state.

Specifically, the second clock signal is in a high level state, and the seventh transistor M7 is turned off. Since the third node N3 is in a low level state, the sixth transistor M6 is turned on, the second clock signal in a high level state is written to the sixth node N6 through the sixth transistor M6, and the sixth node N6 is in a high level state. Since the third transistor M3 is turned on, the low level voltage VGL is written to the third node N3 through the third transistor M3 and the impedance transistor M_R, and the third node N3 is still in a low level state and the voltage is approximately equal to VGL.

Since the first node N1 is in a low level state, the eighth transistor M8 is turned on, the high level voltage VGH is written to the fifth node N5 through the eighth transistor M8, the fifth node N5 is in a high level state, and the ninth transistor M9 is turned off. Meanwhile, the fourth node N4 is in a low level state and the voltage is approximately equal to VGL, the tenth transistor M10 is turned on, the first signal output terminal OUT1 is discharged through the tenth transistor M10. When the voltage at the first signal output terminal OUT1 drops to VN4−Vth_M10 (i.e. when the gate-source voltage of the tenth transistor M10 is equal to Vth_M10, where VN4 is the voltage at the fourth node N4 and is approximately equal to VGL, and Vth_M10 is the threshold voltage of the tenth transistor M10 and is a negative value), the tenth transistor M10 is switched to a turned-off state, and the first signal output terminal OUT1 outputs a low level signal and the voltage is approximately equal to VGL−Vth_M10.

It should be noted that, during the fifth phase t5, when the voltage at the first signal output terminal OUT1 drifts upwards, the gate-source voltage of the tenth transistor M10 is lower than the threshold voltage of the tenth transistor M10. At this time, the tenth transistor M10 is turned on again, so that the voltage at the first signal output terminal OUT1 drops. Until the gate-source voltage of the tenth transistor M10 is equal to the threshold voltage of the tenth transistor M10, the tenth transistor M10 is turned off again.

In a sixth phase t6, the first clock signal provided by the first clock signal line CK is in a high level state, the second clock signal provided by the second clock signal line CKB is in a low level state, the first node N1 is in a low level state, the second node N2 is in a high level state, the third node N3 is in a high level state, and the fourth node N4 is in a low level state.

Specifically, the second clock signal is in a low level state, and the seventh transistor M7 is turned on. Since the third node N3 is in a high level state, the sixth transistor M6 is turned off. Since the first node N1 is in a low level state, the eighth transistor M8 is turned on, the high level voltage VGH is written to the fifth node N5 through the eighth transistor M8, the fifth node N5 is in a high level state, and the ninth transistor M9 is turned off. Meanwhile, since the seventh transistor M7 is turned on, the high level voltage VGH may charge the sixth node N6 through the eighth transistor M8 and the seventh transistor M7, and the sixth node N6 is in a high level state.

For the fourth node N4, since the second clock signal is switched from a high level state to a low level state, under the bootstrap action of the first capacitor C1, the voltage at the fourth node N4 is pulled down from being approximately equal to VGL to be approximately equal to 2VGL. The tenth transistor M10 is turned on again, and the first signal output terminal OUT1 is discharged through the tenth transistor M10. Without considering the impedance of the tenth transistor M10, the voltage at the first signal output terminal OUT1 may drop to VGL. The gate-source voltage of the tenth transistor M10 is always lower than the threshold voltage of the tenth transistor M10, the tenth transistor M10 is continuously turned on, and the first signal output terminal OUT1 outputs a low level signal and the voltage is approximately equal to VGL.

It should be noted that, during the process that the shift register repeats performing the fifth phase t5 and the sixth phase t6 in sequence, although the voltage at the fourth node N4 is switched between being approximately equal to VGL and being approximately equal to 2VGL, the voltage at the first signal output terminal OUT1 is always maintained to be approximately equal to VGL.

It should be noted that, in the embodiment of the present disclosure, the first output control circuit 1 may also adopt other structures. Fr example, the first output control circuit 1 only includes the ninth transistor M9 and the tenth transistor M10, or some other transistors are added on the basis of the ninth transistor M9 and the tenth transistor M10 according to practical needs. In addition, the driving timing of the shift register is not limited to that shown in FIG. 5.

Figure 6:
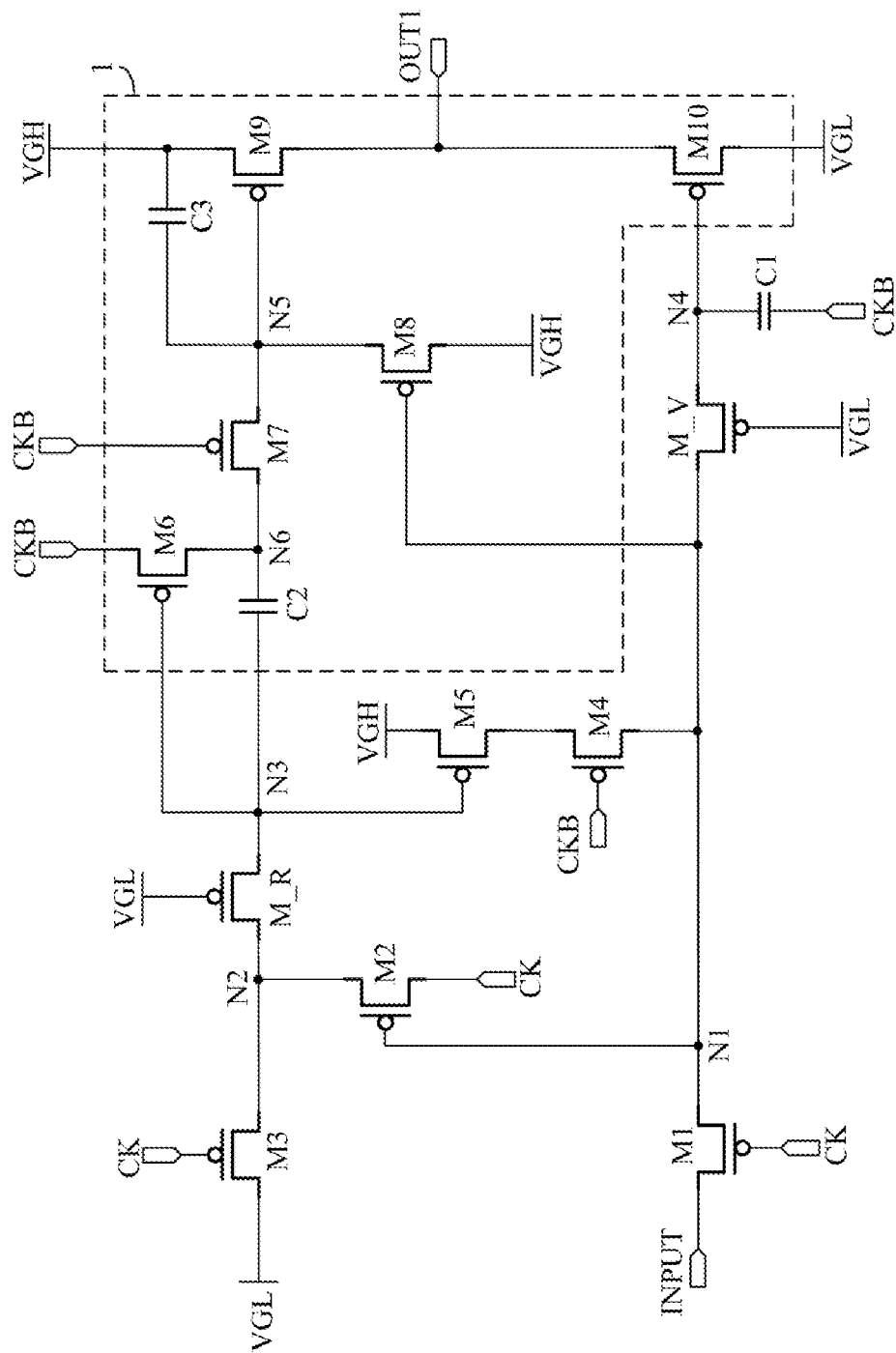
FIG. 6 is a schematic diagram of a circuit structure of another shift register according to an embodiment of the present disclosure.

FIG. 6 is a schematic diagram of a circuit structure of another shift register according to an embodiment of the present disclosure. As shown in FIG. 6, it is different from the shift registers shown in FIGS. 2 and 4 in that, the shift register shown in FIG. 6 further includes a voltage limiting transistor M_V, wherein the first node N1 is coupled to the fourth node N4 through the voltage limiting transistor M_V. Specifically, a control electrode of the voltage limiting transistor M_V is coupled to the first power terminal, a first electrode of the voltage limiting transistor M_V is coupled to the first node N1, and a second electrode of the voltage limiting transistor M_V is coupled to the fourth node N4.

Figure 7:
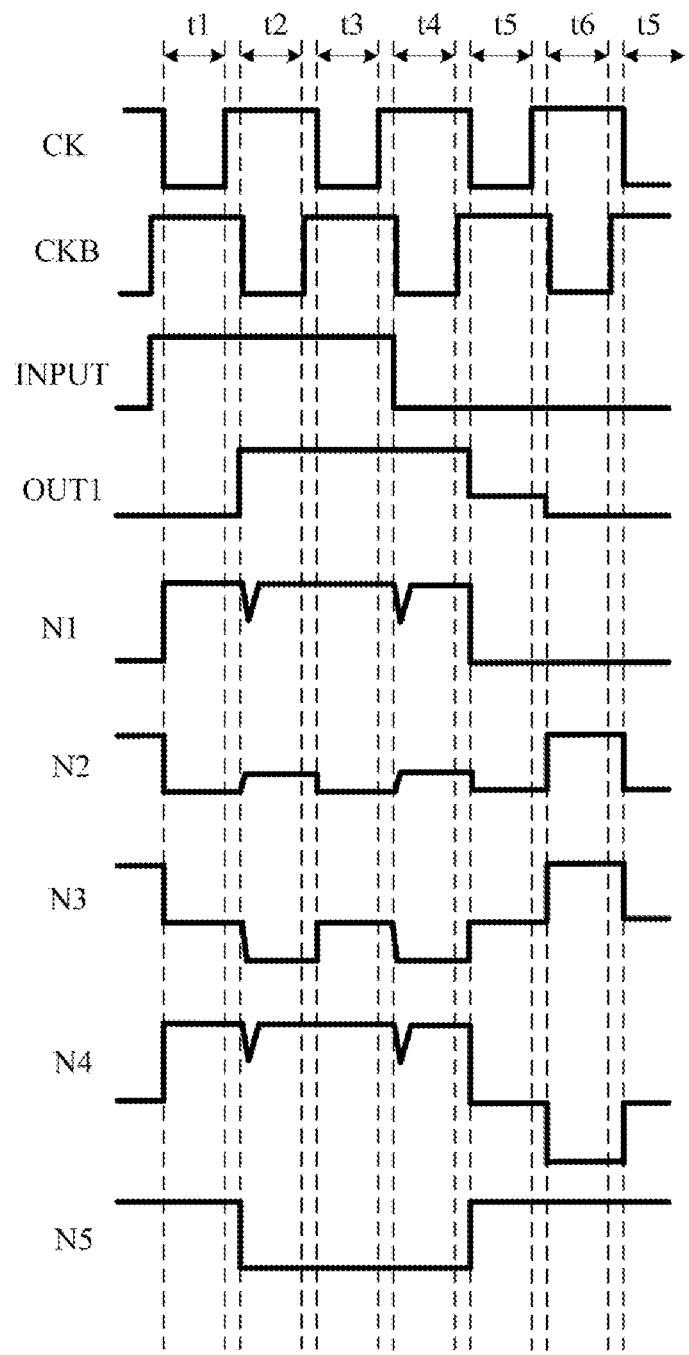
FIG. 7 is a timing diagram illustrating an operation of the shift register shown in FIG. 6.

FIG. 7 is a timing diagram illustrating an operation of the shift register shown in FIG. 6. As shown in FIG. 7, it is different from the synchronous change of the voltages at the first node N1 and the fourth node N4 shown in FIGS. 3 and 5 in that, in the timing diagram shown in FIG. 7, in the sixth phase t6, when the voltage at the fourth node N4 is pulled down by the first capacitor C1 from being approximately equal to VGL to being approximately equal to 2VGL, the gate-source voltage of the voltage-limiting transistor M_V is greater than the threshold voltage of the voltage-limiting transistor M_V, and at this time, the voltage-limiting transistor M_V is switched from a turned-on state to a turned-off state, so that the too low voltage (approximately equal to 2VGL) at the fourth node N4 can be prevented from being written into the first node N1. Therefore, the first transistor M1 and the second transistor M2 can be prevented from being in a high voltage state, and the service lives of the first transistor M1 and the second transistor M2 can be further improved.

Figure 8:
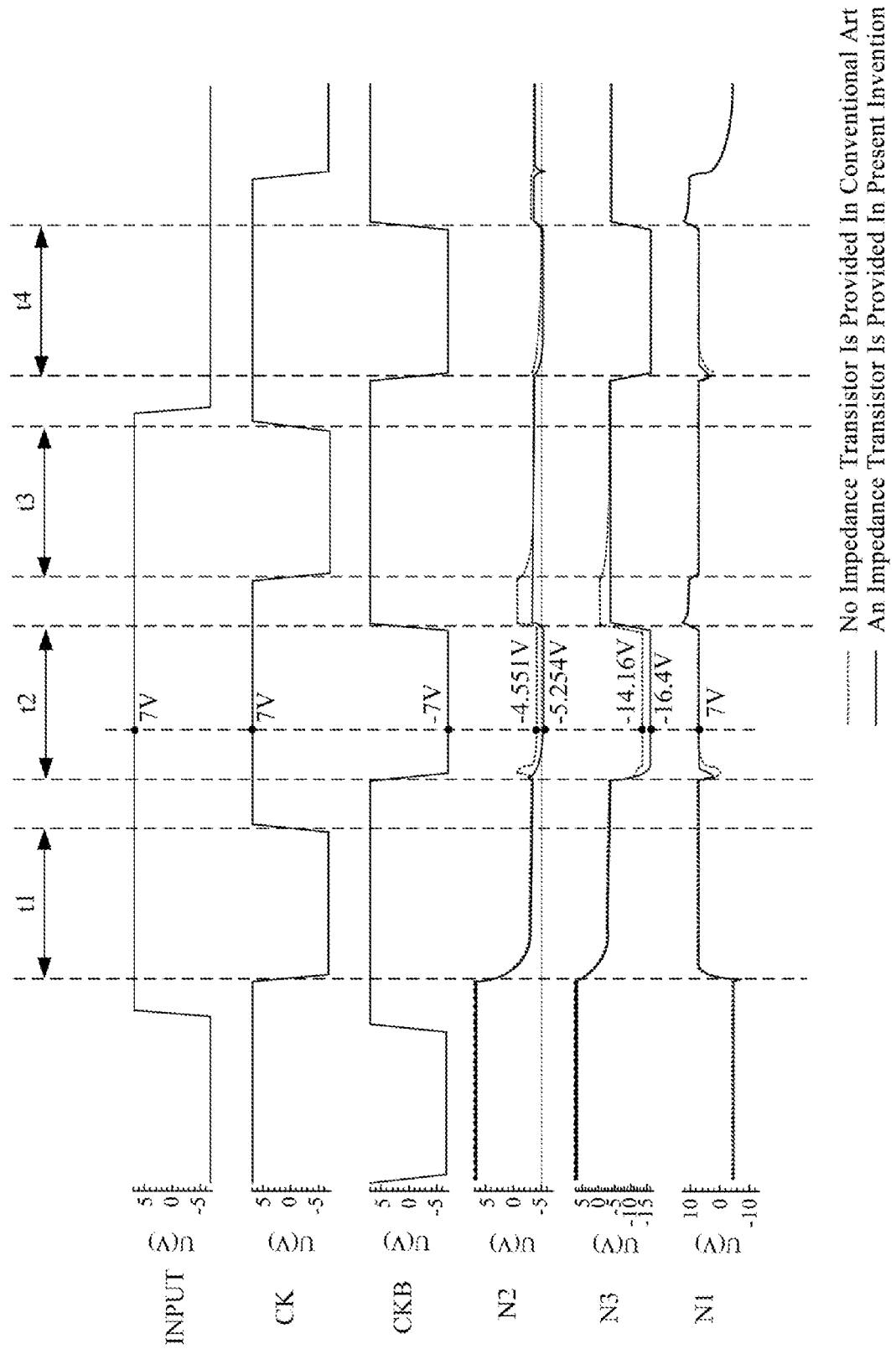
FIG. 8 is a schematic diagram showing a comparison between the voltage variations of the first node, the second node and the third node when there is an impedance transistor and when there is no impedance transistor in the shift register shown in FIG. 6.

FIG. 8 is a schematic diagram showing a comparison between voltage changes of the first node, the second node and the third node when there is an impedance transistor and there is no impedance transistor in the shift register shown in FIG. 6. Referring to FIG. 8, for example, a simulation test is performed by taking a voltage of the first clock signal and the second clock signal in a high level state as +7V, and a voltage in a low level state as −7V.

When the impedance transistor is not included, in the second phase t2, the voltage at the second node N2 is −4.551V, and the voltage at the third node N3 is −14.16V. When the impedance transistor M_R is included in the shift register according to the present disclosure, in the second phase t2, the voltage at the second node N2 is −5.245V, and the voltage at the third node N3 is −16.4V. It can be seen that, with the impedance transistor M_R, the second node N2 and the third node N3 may be pulled down to lower levels in the second phase t2, respectively, which is beneficial to ensuring the stability of a voltage of the control electrode of the fifth transistor M5.

Figure 9A:
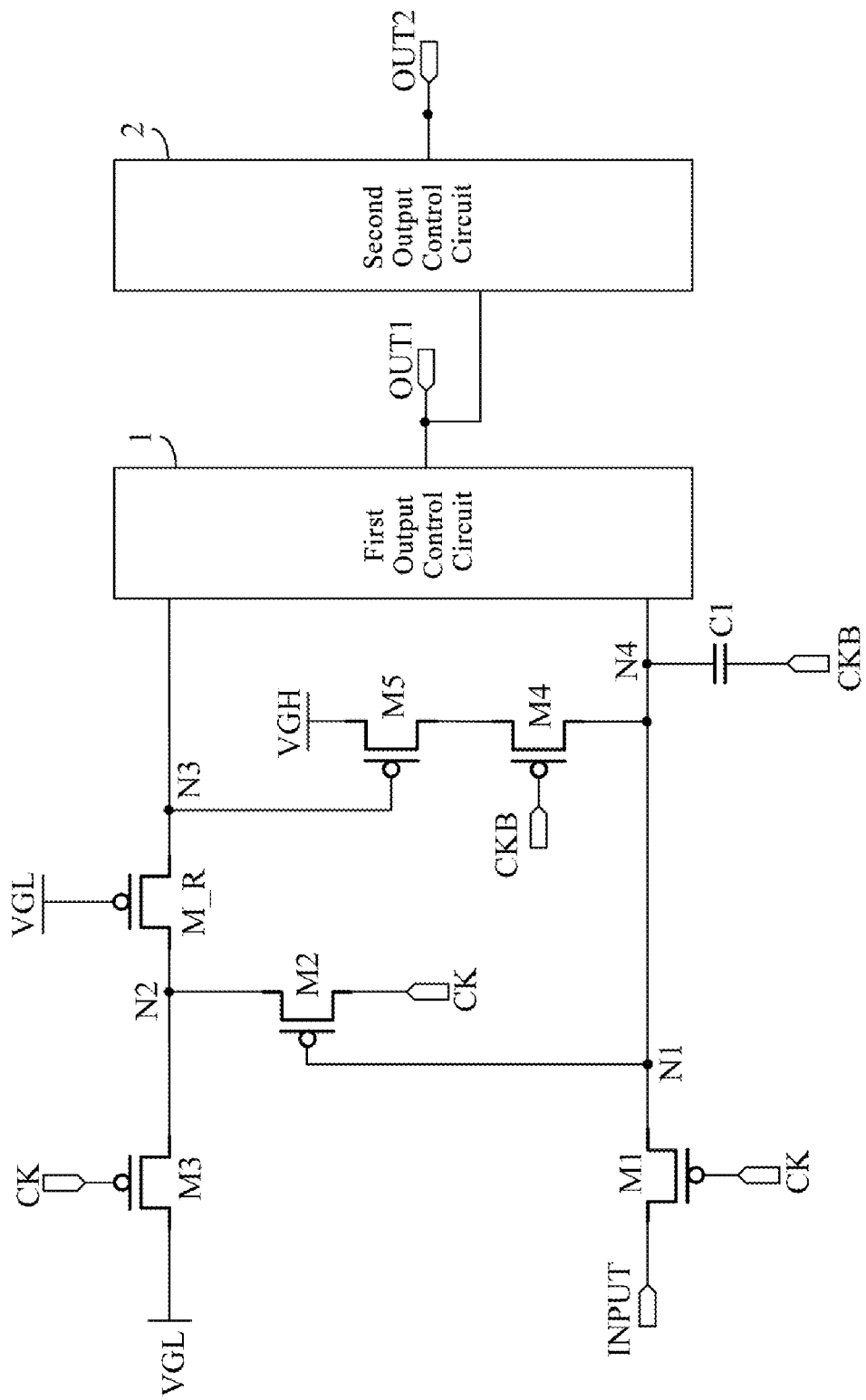
FIG. 9A is a schematic diagram of a circuit structure of another shift register according to an embodiment of the present disclosure.

FIG. 9A is a schematic diagram of a circuit structure of another shift register according to an embodiment of the present disclosure, and as shown in FIG. 9A, it is different from the shift register shown in the previous embodiments in that, the shift register shown in FIG. 9A further includes a second output control circuit 2.

The second output control circuit 2 is coupled to at least the first signal output terminal OUT1 and the second signal output terminal OUT2. The second output control circuit 2 is configured to output a second driving signal with a phase opposite to that of the first driving signal, to the second signal output terminal OUT2, according to a first driving signal output from the first signal output terminal OUT1.

The second output control circuit 2 may be specifically an inverter circuit with an inversion processing function, the first signal output terminal OUT1 is used as a signal input terminal of the inverter circuit, and the second signal output terminal OUT2 is used as a signal output terminal of the inverter circuit.

In this embodiment, one shift register has two signal output terminals, and the two signal output terminals may output different driving signals, so that the different driving signals may be provided for different driving signal lines, which is beneficial to reducing the number of driving circuits arranged in a non-pixel area and is beneficial to realizing a narrow frame of a product.

As a specific example, the first signal output terminal OUT1 of the shift register is connected to a light emitting control signal line configured for the pixel circuit, the second signal output terminal OUT2 of the shift register is connected to a reset signal line configured for the pixel circuit, the first driving signal output from the first signal output terminal OUT1 is a light emitting control signal, and the second driving signal output from the second signal output terminal OUT2 is a reset signal.

Figure 9B:
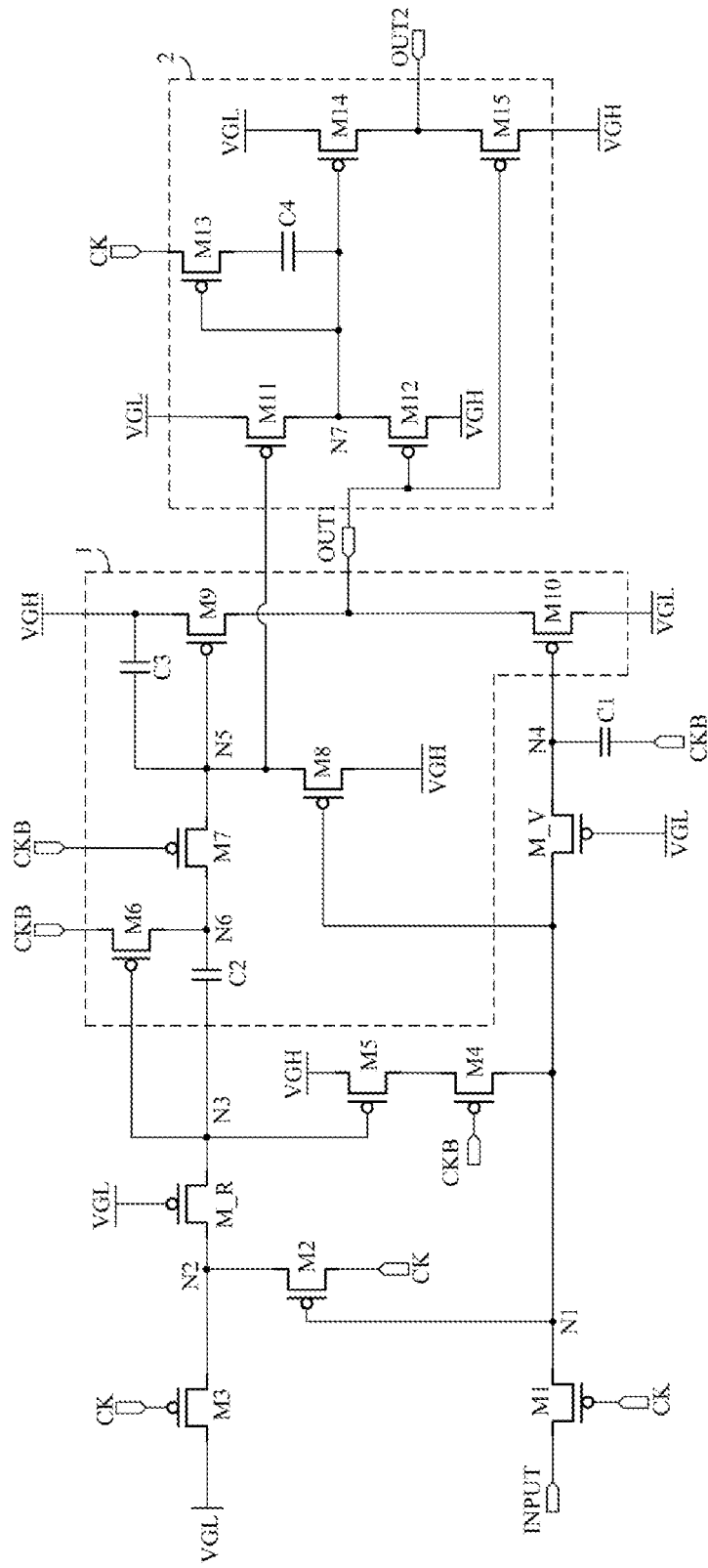
FIG. 9B is a schematic diagram of a circuit structure of another shift register according to an embodiment of the present disclosure.

FIG. 9B is a schematic diagram of a circuit structure of another shift register according to an embodiment of the present disclosure. As shown in FIG. 9B, the shift register shown in FIG. 9B is a specific alternative embodiment based on the shift register shown in FIG. 9A, the first output control circuit 1 shown in FIG. 9B is shown as that in FIGS. 4 and 6, and details of a specific structure of the first output control circuit 1 are not repeated herein.

In some embodiments, the second output control circuit 2 includes an eleventh transistor M11, a twelfth transistor M12, a thirteenth transistor M13, a fourteenth transistor M14, a fifteenth transistor M15, and a fourth capacitor C4.

A control electrode of the eleventh transistor M11 is coupled to the fifth node N5, a first electrode of the eleventh transistor M11 is coupled to the first power terminal, and a second electrode of the eleventh transistor M11 is coupled to a seventh node N7. A control electrode of the twelfth transistor M12 is coupled to the first signal output terminal OUT1, a first electrode of the twelfth transistor M12 is coupled to the seventh node N7, and a second electrode of the twelfth transistor M12 is coupled to the second power terminal. A control electrode of the thirteenth transistor M13 is coupled to the seventh node N7, a first electrode of the thirteenth transistor M13 is coupled to the first clock signal line CK, and a second electrode of the thirteenth transistor M13 is coupled to a first electrode of the fourth capacitor C4. For the fourteenth transistor M14, a control electrode of the fourteenth transistor M14 is coupled to the seventh node N7, a first electrode of the fourteenth transistor M14 is coupled to the first power terminal, and a second electrode of the fourteenth transistor M14 is coupled to the second signal output terminal OUT2. For the fifteenth transistor M15, a control electrode of the fifteenth transistor M15 is coupled to the first signal output terminal OUT1, a first electrode of the fifteenth transistor M15 is coupled to the second signal output terminal OUT2, and a second electrode of the fifteenth transistor M15 is coupled to the second power terminal. A second electrode of the fourth capacitor C4 is coupled to the seventh node N7.

Figure 10:
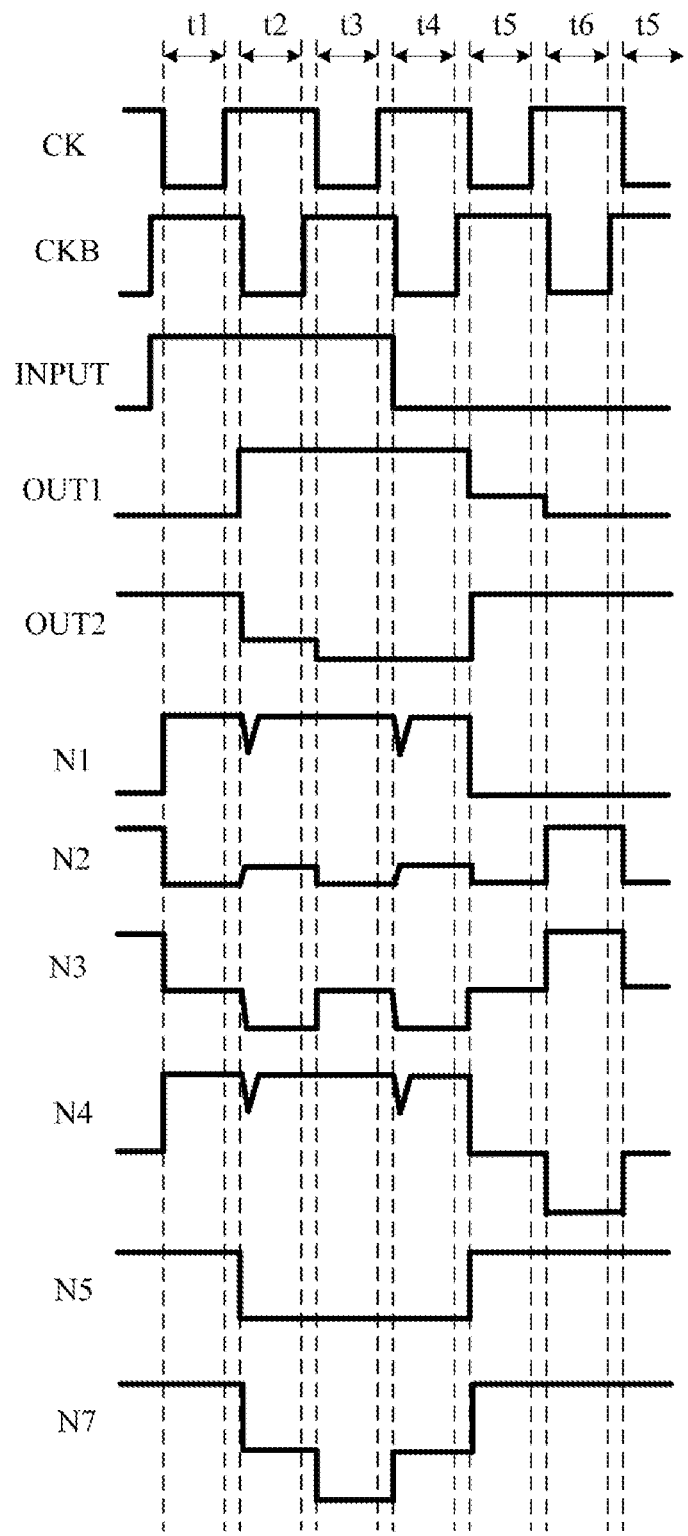
FIG. 10 is a timing diagram illustrating an operation of the shift register shown in FIG. 9B.

FIG. 10 is a timing diagram illustrating an operation of the shift register shown in FIG. 9B. As shown in FIG. 10, the operation states of the first transistor M1 to the tenth transistor M10 in each phase may refer to corresponding descriptions of the previous embodiments, which are not repeated herein, and only the detailed operation process of the second output control circuit 2 is described in detail below.

In a first phase t1, the first clock signal provided by the first clock signal line CK is in a low level state, the second clock signal provided by the second clock signal line CKB is in a high level state, the fifth node N5 is in a high level state, and the first signal output terminal OUT1 is in a low level state.

Since the fifth node N5 is in a high level state and the first signal output terminal OUT1 is in a low level state, the eleventh transistor M11 is turned off. The twelfth transistor M12 and the fifteenth transistor M15 are turned on, the high level voltage VGH is written to the seventh node N7 through the twelfth transistor M12, the seventh node N7 is in a high level state, and the fourteenth transistor M14 is turned off.

Since the fourteenth transistor M14 is in a turned-off state and the fifteenth transistor M15 is in a turned-on state, the high level voltage VGH is written to the second signal output terminal OUT2 through the fifteenth transistor M15, and the second signal output terminal OUT2 outputs a high level signal.

In a second phase t2, the first clock signal provided by the first clock signal line CK is in a high level state, the second clock signal provided by the second clock signal line CKB is in a low level state, the fifth node N5 is in a low level state, and the first signal output terminal OUT1 is in a high level state.

Since the fifth node N5 is in a low level state, the first signal output terminal OUT1 is in a high level state, the eleventh transistor M11 is turned on, the twelfth transistor M12 and the fifteenth transistor M15 are turned off. The low level voltage VGL is written to the seventh node N7 through the eleventh transistor M11, the seventh node N7 is in a low level state and the voltage is approximately equal to VGL. The thirteenth transistor M13 and the fourteenth transistor M14 are turned on, the second signal output terminal OUT2 is discharged through the fourteenth transistor M14. When the voltage of the second signal output terminal OUT2 drops to VGL−Vth_M14 (i.e., when the gate-source power of the fourteenth transistor M14 is equal to Vth_M14, wherein VN7 is the voltage at the seventh node N7 and is approximately equal to VGL, and Vth_M14 is the threshold voltage of the fourteenth transistor M14 and is a negative value), the fourteenth transistor M14 is switched to a turned-off state, and the second signal output terminal OUT2 outputs a low level signal and the voltage is approximately equal to VGL−Vth_M14.

It should be noted that, during the second phase t2, when the voltage at the second signal output terminal OUT2 drifts upwards, the gate-source voltage of the fourteenth transistor M14 is lower than the threshold voltage of the fourteenth transistor M14. At this time, the fourteenth transistor M14 is turned on again, so that the voltage at the second signal output terminal OUT2 drops. Until the gate-source voltage of the fourteenth transistor M14 is equal to the threshold voltage of the fourteenth transistor M14, the fourteenth transistor M14 is turned off again.

In a third phase t3, the first clock signal provided by the first clock signal line CK is in a low level state, the second clock signal provided by the second clock signal line CKB is in a high level state, the fifth node N5 is in a low level state, and the first signal output terminal OUT1 is in a high level state.

At the initial moment of the third phase t3, since the fifth node N5 is in a low state and the first signal output terminal OUT1 is in a high level state, the eleventh transistor M11 is turned on, the twelfth transistor M12 and the fifteenth transistor M15 are turned off. The low level voltage VGL is written into the seventh node N7 through the eleventh transistor M11, the seventh node N7 is in a low level state, and the thirteenth transistor M13 and the fourteenth transistor M14 are turned on.

When the first clock signal is switched from a high level state to a low level state, under the bootstrap action of the fourth capacitor C4, the voltage at the seventh node N7 is pulled down from being approximately equal to VGL to being approximately equal to 2VGL, the fourteenth transistor M14 is turned on again, and the second signal output terminal OUT2 is discharged through the fourteenth transistor M14. Without considering the impedance of the fourteenth transistor M14, the voltage at the second signal output terminal OUT2 may drop to VGL. The gate-source voltage of the fourteenth transistor M14 is always lower than the threshold voltage of the fourteenth transistor M14, the fourteenth transistor M14 is continuously turned on, and the second signal output terminal OUT2 outputs a low level signal and the voltage is approximately equal to VGL.

In a fourth phase t4, the first clock signal provided by the first clock signal line CK is in a high level state, the second clock signal provided by the second clock signal line CKB is in a low level state, the fifth node N5 is in a low level state, and the first signal output terminal OUT1 is in a high level state.

When the first clock signal is switched from a low level state to a high level state, under the bootstrap action of the fourth capacitor C4, the voltage at the seventh node N7 is pulled up from being approximately equal to 2VGL to being approximately equal to VGL. The eleventh transistor M11 is turned on, the low level voltage VGL is written into the seventh node N7 through the eleventh transistor M11, the seventh node N7 maintains a low level state and the voltage is approximately equal to VGL. The gate-source voltage of the fourteenth transistor M14 is approximately equal to 0, and the fourteenth transistor is turned off. Since the first signal output terminal OUT1 outputs a high level signal, both the twelfth transistor M12 and the fifteenth transistor M15 are turned off. The second signal output terminal OUT2 is in a floating state to maintain a low level state of the previous phase (the third phase t3), and the second signal output terminal OUT2 outputs a low level signal and the voltage is approximately equal to VGL.

In a fifth phase t5, the first clock signal provided by the first clock signal line CK is in a low level state, the second clock signal provided by the second clock signal line CKB is in a high level state, the fifth node N5 is in a high level state, and the first signal output terminal OUT1 is in a low level state.

Since the fifth node N5 is in a high level state and the first signal output terminal OUT1 is in a low level state, the eleventh transistor M11 is turned off, the twelfth transistor M12 and the fifteenth transistor M15 are turned on. The high level voltage VGH is written to the seventh node N7 through the twelfth transistor M12, the seventh node N7 is in a high level state, and the fourteenth transistor M14 is turned off.

Since the fourteenth transistor M14 is in a turned-off state and the fifteenth transistor M15 is in a turned-on state, the high level voltage VGH is written to the second signal output terminal OUT2 through the fifteenth transistor M15, and the second signal output terminal OUT2 outputs a high level signal.

In a sixth phase t6, the first clock signal provided by the first clock signal line CK is in a high level state, the second clock signal provided by the second clock signal line CKB is in a low level state, the fifth node N5 is in a high level state, and the first signal output terminal OUT1 is in a low level state.

The operation process of the second output control circuit 2 in the sixth phase t6 is the same as the operation process in the fifth phase t5, and specific reference may be made to the corresponding description of the fifth phase t5.

Figure 11:
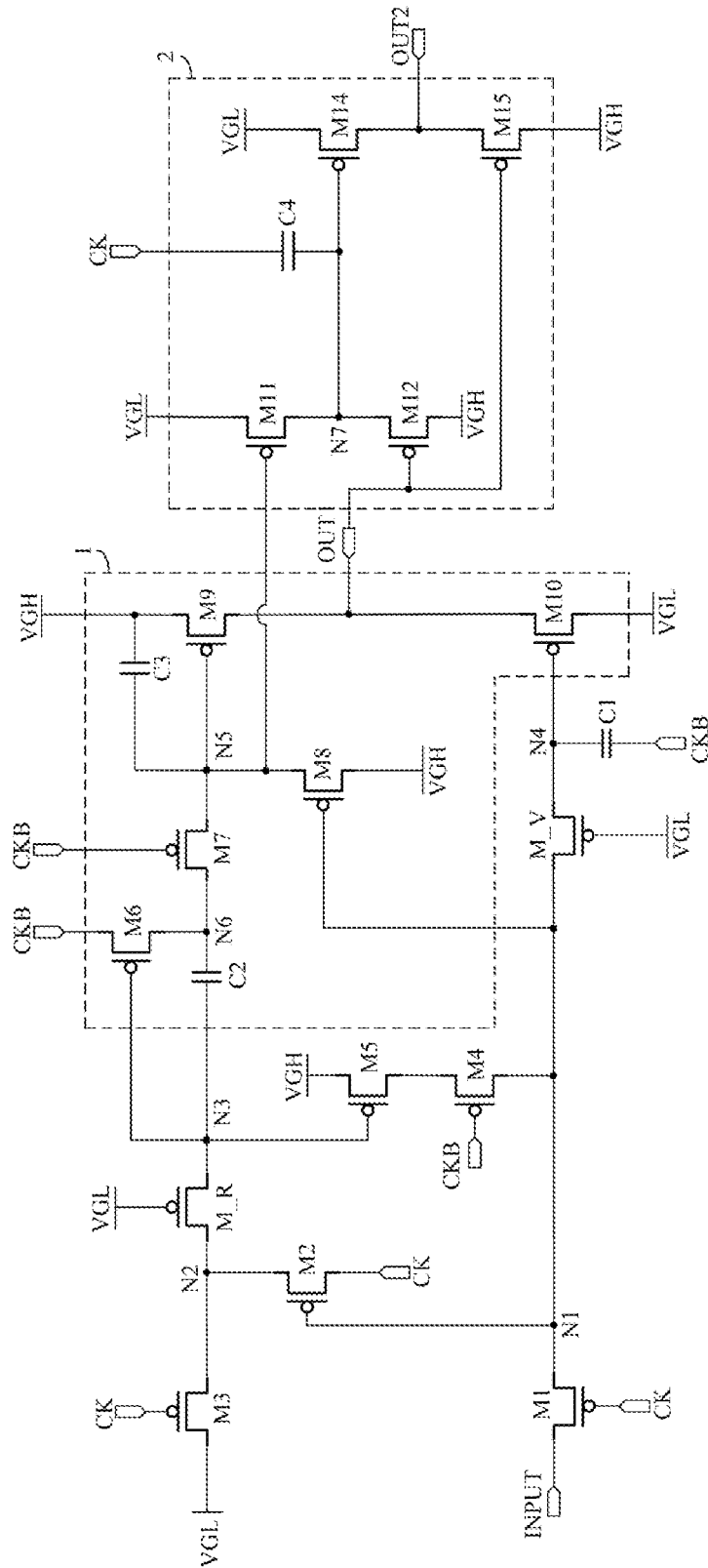
FIG. 11 is a schematic diagram of a circuit structure of another shift register according to an embodiment of the present disclosure.

FIG. 11 is a schematic diagram of a circuit structure of another shift register according to an embodiment of the present disclosure. As shown in FIG. 11, it is different from the second output control circuit 2 in the shift register shown in FIG. 9B in that, the second output control circuit 2 in the shift register shown in FIG. 11 only includes the eleventh transistor M11, the twelfth transistor M12, the fourteenth transistor M14, the fifteenth transistor M15 and the fourth capacitor C4, but does not include the thirteenth transistor M13, and the first electrode of the fourth capacitor C4 is coupled to the first clock signal line CK. The operation timing of the shift register shown in FIG. 11 may be as shown in FIG. 10, and the detailed process is not repeated herein.

Figure 12:
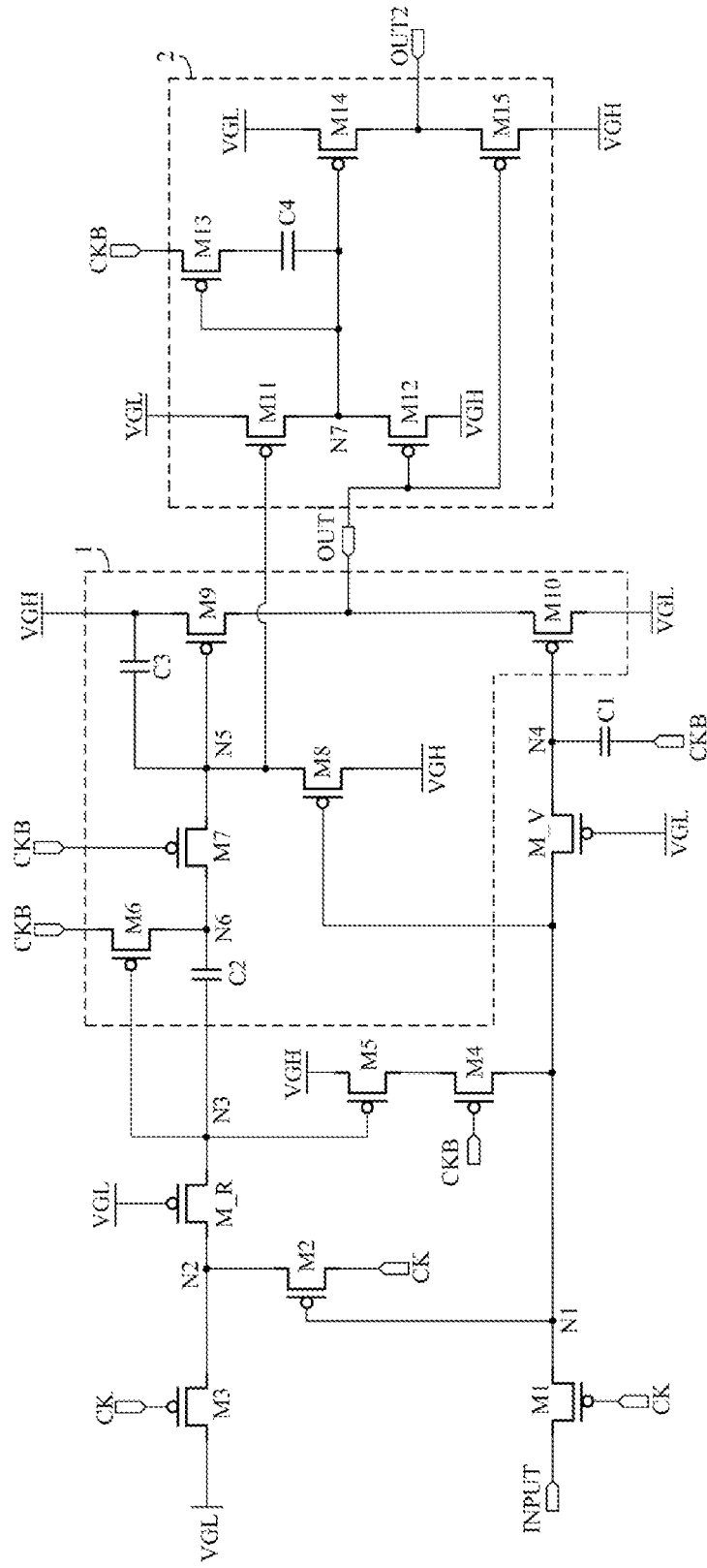
FIG. 12 is a schematic diagram of a circuit structure of another shift register according to an embodiment of the present disclosure.

FIG. 12 is a schematic diagram of a circuit structure of another shift register according to an embodiment of the present disclosure. As shown in FIG. 12, it is different from the second output control circuit 2 in the shift register shown in FIG. 9B in that, the first electrode of the thirteenth transistor M13 in the shift register shown in FIG. 12 is coupled to the second clock signal line CKB.

Figure 13:
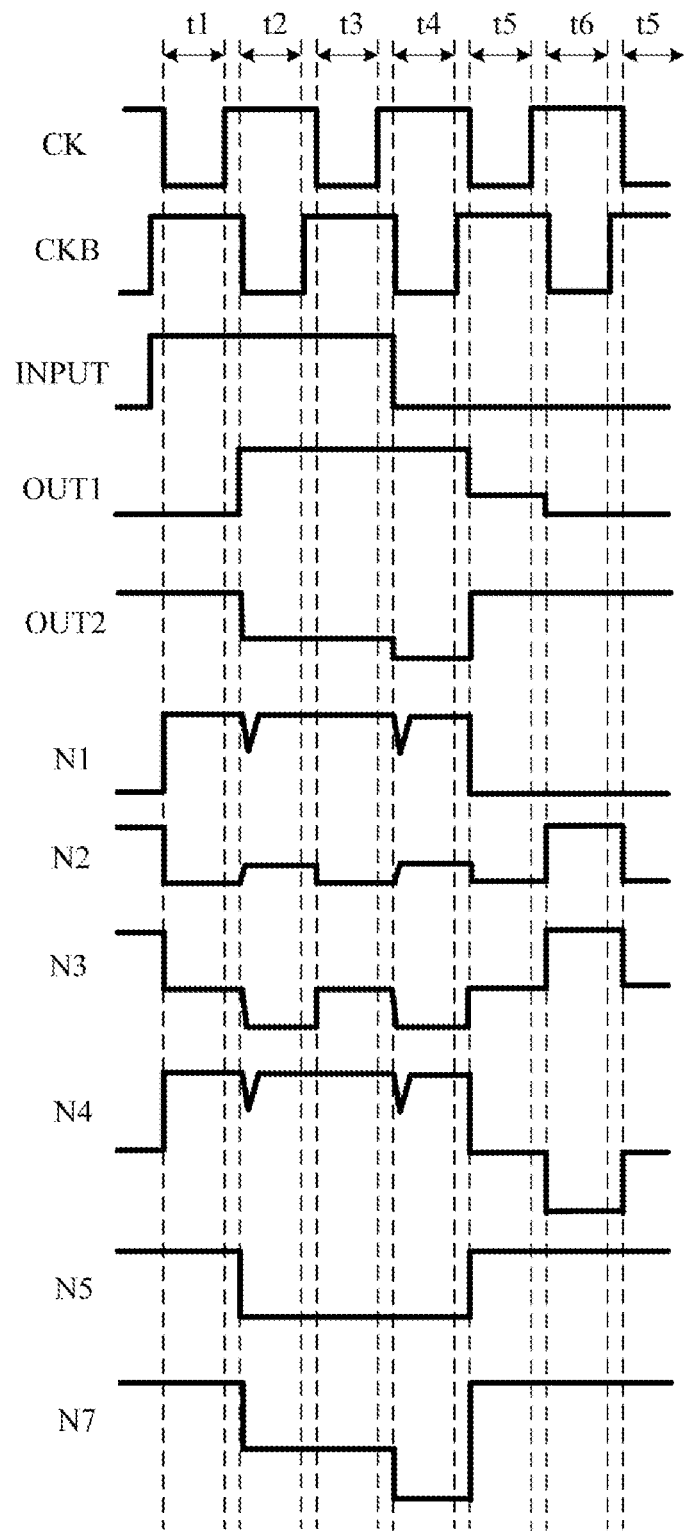
FIG. 13 is a timing diagram illustrating an operation of the shift register shown in FIG. 12.

FIG. 13 is a timing diagram illustrating an operation of the shift register shown in FIG. 12. As shown in FIG. 13, the operation states of the first transistor M1 to the tenth transistor M10 in each phase may refer to corresponding descriptions of the previous embodiments, which are not repeated herein, and only the detailed operation process of the second output control circuit 2 is described in detail below.

The operation processes of the second control circuit in the shift register shown in FIG. 12 in the first phase t1 and the second phase t2 are the same as the operation processes of the second control circuit in the shift register shown in FIG. 9B in the first phase t1 and the second phase t2, and are not repeated herein.

In a third phase t3, the first clock signal provided by the first clock signal line CK is in a low level state, the second clock signal provided by the second clock signal line CKB is in a high level state, the fifth node N5 is in a low level state, and the first signal output terminal OUT1 is in a high level state.

Since the fifth node N5 is in a low level state and the first signal output terminal OUT1 is in a high level state, the eleventh transistor M11 is turned on, the twelfth transistor M12 and the fifteenth transistor M15 are turned off. The low level voltage VGL is written to the seventh node N7 through the eleventh transistor M11, the seventh node N7 is in a low level state and the voltage is approximately equal to VGL, the fourteenth transistor M14 maintains a turned-off state of the previous phase (the second phase t2), and the second signal output terminal OUT2 outputs a low level signal and the voltage is approximately equal to VGL.

In a fourth phase t4, the first clock signal provided by the first clock signal line CK is in a high level state, the second clock signal provided by the second clock signal line CKB is in a low level state, the fifth node N5 is in a low level state, and the first signal output terminal OUT1 is in a high level state.

When the second clock signal is switched from a high level state to a low level state, under the bootstrap action of the fourth capacitor C4, the voltage at the seventh node N7 is pulled down from being approximately equal to VGL to being approximately equal to 2VGL, the fourteenth transistor M14 is turned on again, and the second signal output terminal OUT2 is discharged through the fourteenth transistor M14. Without considering the impedance of the fourteenth transistor M14, the voltage at the second signal output terminal OUT2 may drop to VGL. The gate-source voltage of the fourteenth transistor M14 is always lower than the threshold voltage of the fourteenth transistor M14, the fourteenth transistor M14 is continuously turned on, and the second signal output terminal OUT2 outputs a low level signal and the voltage is approximately equal to VGL.

The operation processes of the second control circuit in the shift register shown in FIG. 12 in the fifth phase t5 and the sixth phase t6 are the same as the operation processes of the second control circuit in the shift register shown in FIG. 9B in the fifth phase t5 and the sixth phase t6, and are not repeated herein.

Figure 14:
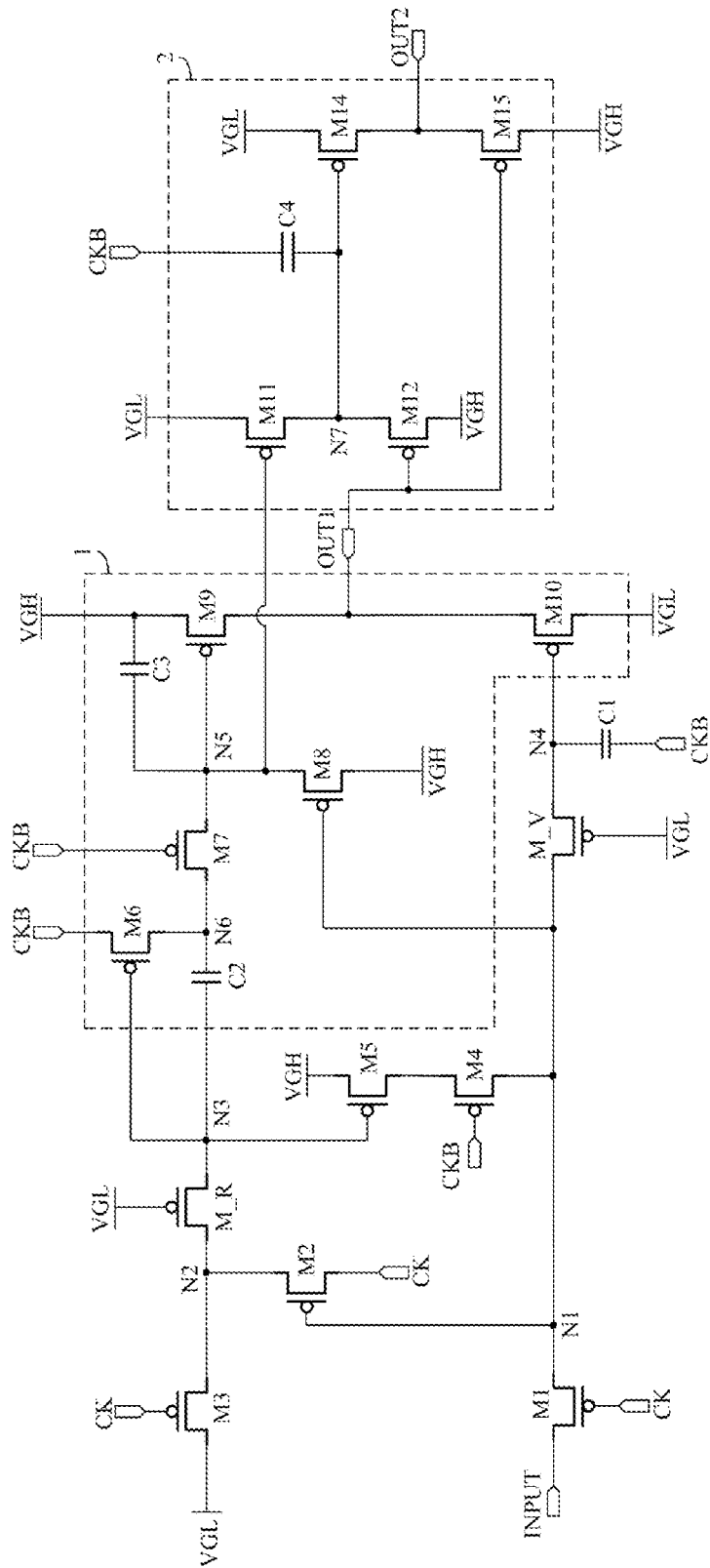
FIG. 14 is a schematic diagram of a circuit structure of another shift register according to an embodiment of the present disclosure.

FIG. 14 is a schematic diagram of a circuit structure of another shift register according to an embodiment of the present disclosure. As shown in FIG. 14, it is different from the second output control circuit 2 in the shift register shown in FIG. 12 in that, the second output control circuit 2 in the shift register shown in FIG. 14 only includes the eleventh transistor M11, the twelfth transistor M12, the fourteenth transistor M14, the fifteenth transistor M15 and the fourth capacitor C4, but does not include the thirteenth transistor M13, and the first electrode of the fourth capacitor C4 is coupled to the second clock signal line CKB. The operation timing of the shift register shown in FIG. 14 may be as shown in FIG. 13, and the detailed process is not repeated herein.

It should be noted that, in the embodiment of the present disclosure, the second output control circuit 2 in the shift register may also adopt other circuit structures with an inversion processing function, which will not be exemplified herein.

Figure 15:
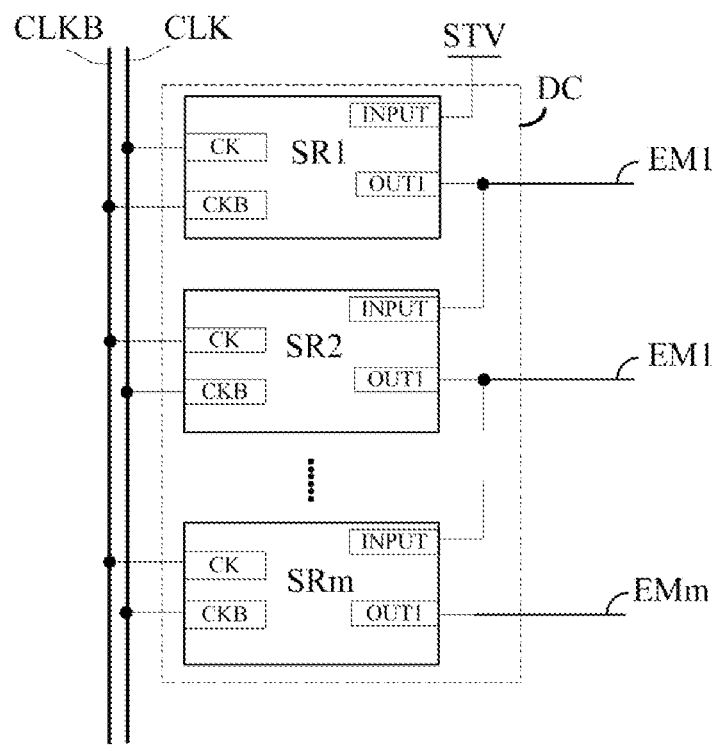
FIG. 15 is a schematic diagram of a circuit structure of a driving circuit in a peripheral area according to an embodiment of the present disclosure.

Based on the same inventive concept, an embodiment of the present disclosure also provides a driving circuit. FIG. 15 is a schematic diagram of a circuit structure of a driving circuit in the peripheral area according to an embodiment of the present disclosure. As shown in FIG. 15, the driving circuit includes a plurality of shift registers SR1/SR2 . . . /SRm arranged in cascade, wherein the shift registers SR1/SR2 . . . /SRm each may adopt the shift register according to any one of the previous embodiments.

Specifically, the signal input terminal INPUT of the shift register SR1 of a first stage is coupled to a frame start signal terminal STV, and the signal input terminal of each of the shift registers/SR2 . . . /SRm (except the shift register SR1 of the first stage) is connected to the first signal output terminal OUT1 of the shift register of a previous one stage.

The first clock signal terminals CK of the shift registers SR1/SR3 . . . of odd-numbered stages are coupled to the first clock signal line CLK, and the second clock signal terminals CKB of the shift registers SR1/SR3 . . . of odd-numbered stages are coupled to the second clock signal line CLKB. The first clock signal terminal CK of the shift registers SR2/SR4 . . . of even-numbered stages are coupled to the second clock signal line CLKB, and the second clock signal terminals CKB of the shift registers SR2/SR4 . . . of even-numbered stages are coupled to the first clock signal line CLK. The first power terminal of each of the shift registers SR1/SR2 . . . /SRm is coupled to a first power voltage supply line (not shown), and the second power terminal of each of the shift registers SR1/SR2 . . . /SRm is connected to a second power voltage supply line (not shown).

The first signal output terminal OUT1 of each stage of the shift register SR1/SR2 . . . /SRm is coupled to a corresponding one of light emitting control signal lines EM1/EM2 . . . /EMm in the display area. For example, the first signal output terminal OUT1 of the shift register SRi of the i-th stage is coupled to the light emitting control line EMi corresponding to the pixel units in the i-th row in the display area, where i is a positive integer and is less than or equal to m.

Figure 16:
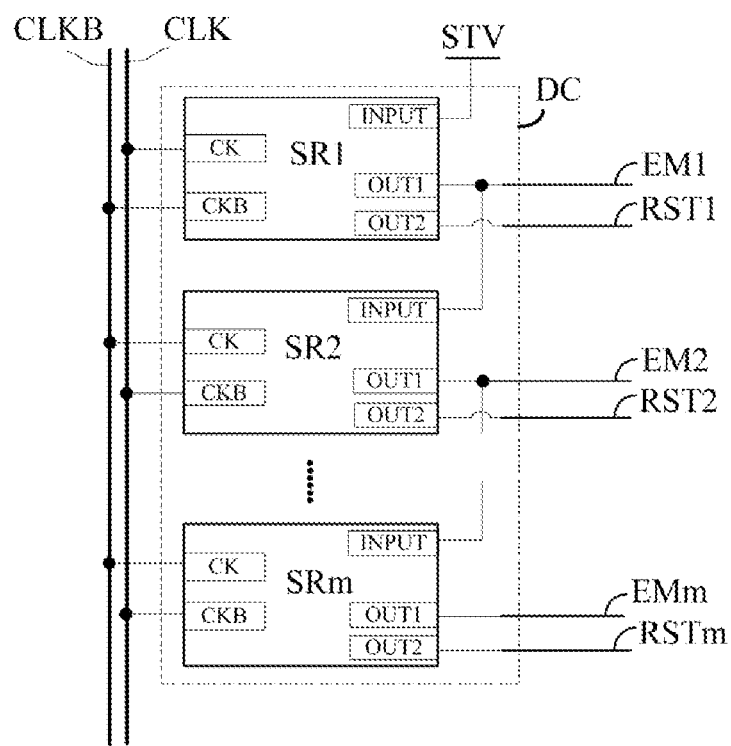
FIG. 16 is a schematic diagram of another circuit structure of a driving circuit in a peripheral area according to the present disclosure.

FIG. 16 is a schematic diagram of another circuit structure of a driving circuit in the peripheral area according to the embodiment of the present disclosure. As shown in FIG. 16, when each pixel unit in the display area is further configured with a corresponding reset signal line, a second output control circuit (including a second signal output terminal OUT2) is further disposed in each stage of the shift register SR1/SR2 . . . /SRm in the driving circuit, for example, the shift register adopts the configuration shown in FIG. 9A, 9B, 11, 12 or 14. In this case, the first signal output terminal OUT1 of each stage of the shift register SR1/SR2 . . . /SRm is coupled to a corresponding one of the light emitting control signal lines EM1/EM2 . . . /EMm in the display area, and the second signal output terminal OUT2 of each stage of the shift register SR1/SR2 . . . /SRm is connected to a corresponding one of the reset signal lines RST1/RST2 . . . /RSTm in the display area.

For example, the first signal output terminal OUT1 of the shift register SRi of the i-th stage is coupled to the light emitting control line EMi corresponding to the pixel units in the i-th row in the display area, and the second signal output terminal OUT2 of the shift register SRi of the i-th stage is coupled to the reset signal line RSTi corresponding to the pixel units in the i-th row in the display area, where i is a positive integer and is less than or equal to m.

With continued reference to FIG. 1, based on the same inventive concept, an embodiment of the present disclosure further provides a display substrate, including a display area A and a peripheral area B surrounding the display area A, wherein a plurality of pixel units in an array are arranged in the display area A, each pixel unit is provided with a corresponding light emitting control signal line, a light emitting control driving circuit is arranged in the peripheral area B and comprises a plurality of shift registers arranged in cascade, the shift registers in the light emitting control driving circuit each adopt the shift register provided by any one of the previous embodiments, and a first signal output terminal OUT1 of the shift register in the light emitting control driving circuit is coupled to a corresponding light emitting control signal line in the display area. For the description of the light emitting control driving circuit and the shift register in the light emitting control driving circuit in this embodiment, reference may be made to the contents of the previous embodiments, and details thereof are not repeated herein.

In the embodiments of the present disclosure, a pixel circuit and a light emitting device are disposed in a pixel unit. The light emitting device in the present disclosure refers to a current-driven light emitting element including an Organic Light Emitting Diode (OLED), a Light Emitting Diode (LED), and the like. In the embodiments of the present disclosure, the light-emitting device is an OLED as an example for exemplary description, wherein a first terminal and a second terminal of the light-emitting device refer to an anode and a cathode, respectively.

Figure 17:
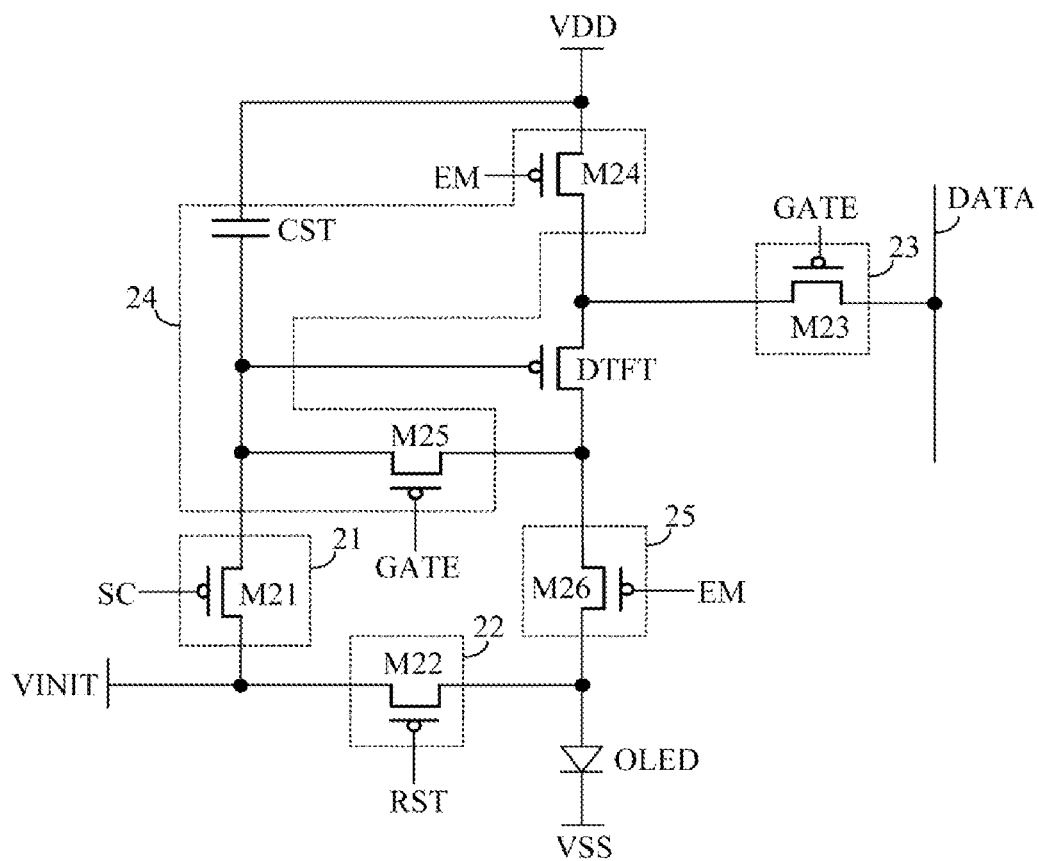
FIG. 17 is a schematic diagram of a circuit structure of a pixel unit according to an embodiment of the present disclosure.

FIG. 17 is a schematic diagram of a circuit structure of a pixel unit according to an embodiment of the present disclosure. As shown in FIG. 17, the pixel unit includes a pixel circuit and a light emitting device, the pixel circuit includes a first reset sub-circuit 21, a second reset sub-circuit 22, a data writing sub-circuit 23, a threshold compensation sub-circuit 24, a light emitting control sub-circuit 25, and a driving transistor DTFT.

The first reset sub-circuit 21 is coupled to an initialization voltage terminal, a control electrode of the driving transistor DTFT and a corresponding scanning control signal line SC, and is configured to write an initialization voltage provided by an initialization voltage terminal to the control electrode of the driving transistor DTFT in response to the control of a scanning control signal provided by a scanning control signal line SC.

The second reset sub-circuit 22 is coupled to the initialization voltage terminal, a first terminal of the light emitting device OLED, and a corresponding reset signal line RST, and is configured to write the initialization voltage to the first terminal of the light emitting device OLED in response to the control of the reset signal line RST.

The data writing sub-circuit 23 is coupled to a first electrode of the driving transistor DTFT, a corresponding data line DATA, and a corresponding scanning signal line GATE, and is configured to write a data voltage provided by the data line DATA to the first electrode of the driving transistor DTFT in response to the control of the scanning signal line GATE.

The threshold compensation sub-circuit 24 is coupled to a second operating voltage terminal, the control electrode of the driving transistor DTFT, the first electrode of the driving transistor DTFT, a second electrode of the driving transistor DTFT, and a corresponding scanning signal line GATE, and is configured to write a data compensation voltage, which is equal to a sum of the data voltage and the threshold voltage of the driving transistor DTFT, to the control electrode of the driving transistor DTFT in response to the control of the scanning signal line GATE.

The light emitting control sub-circuit 25 is located between the second electrode of the driving transistor DTFT and the first terminal of the light emitting device OLED, and is coupled to a light emitting control signal line EM, and is configured to enable a conduction between the second electrode of the driving transistor DTFT and the first terminal of the light emitting device OLED in response to the control of the light emitting control signal provided by the light emitting control signal line EM.

The driving transistor DTFT is configured to output a corresponding driving current in response to the control of the data compensation voltage. A second terminal of the light emitting device OLED is coupled to a first operating voltage terminal.

In some embodiments, the first reset sub-circuit 21 includes a twenty-first transistor M21, the second reset sub-circuit 22 includes a twenty-second transistor M22, the data writing sub-circuit 23 includes a twenty-third transistor M23, the threshold compensation sub-circuit 24 includes a twenty-fourth transistor M24, a twenty-fifth transistor M25 and a storage capacitor CST, and the light emitting control sub-circuit 25 includes a twenty-sixth transistor M26.

A control electrode of the twenty-first transistor M21 is coupled to the scanning control signal line SC, a first electrode of the twenty-first transistor M21 is coupled to the initialization voltage terminal, and a second electrode of the twenty-first transistor M21 is coupled to the control electrode of the driving transistor DTFT. A control electrode of the twenty-second transistor M22 is coupled to the reset signal line RST, a first electrode of the twenty-second transistor M22 is coupled to the initialization voltage terminal, and a second electrode of the twenty-second transistor M22 is coupled to the first terminal of the light emitting device OLED. A control electrode of the twenty-third transistor M23 is coupled to the scanning signal line GATE, a first electrode of the twenty-third transistor M23 is coupled to the data line DATA, and a second electrode of the twenty-third transistor M23 is coupled to the first electrode of the driving transistor DTFT. A control electrode of the twenty-fourth transistor M24 is coupled to the light emitting control signal line EM, a first electrode of the twenty-fourth transistor M24 is coupled to the second operating voltage terminal, and a second electrode of the twenty-fourth transistor M24 is coupled to the first electrode of the driving transistor DTFT. A control electrode of the twenty-fifth transistor M25 is coupled to the scanning signal line GATE, a first electrode of the twenty-fifth transistor M25 is coupled to the control electrode of the driving transistor DTFT, and a second electrode of the twenty-fifth transistor M25 is coupled to the second electrode of the driving transistor DTFT. A first terminal of the storage capacitor CST is coupled to the second operating voltage terminal, and a second terminal of the storage capacitor CST is coupled to the control electrode of the driving transistor DTFT. A control electrode of the twenty-sixth transistor M26 is coupled to the light emitting control signal line EM, a first electrode of the twenty-sixth transistor M26 is coupled to a second electrode of the driving transistor DTFT, and a second electrode of the twenty-sixth transistor M26 is coupled to the first terminal of the light emitting device OLED.

The initialization voltage terminal provides an initialization voltage VINIT, the first operating voltage terminal provides a first operating voltage VDD, and the second operating voltage terminal provides a second operating voltage VSS.

Figure 18:
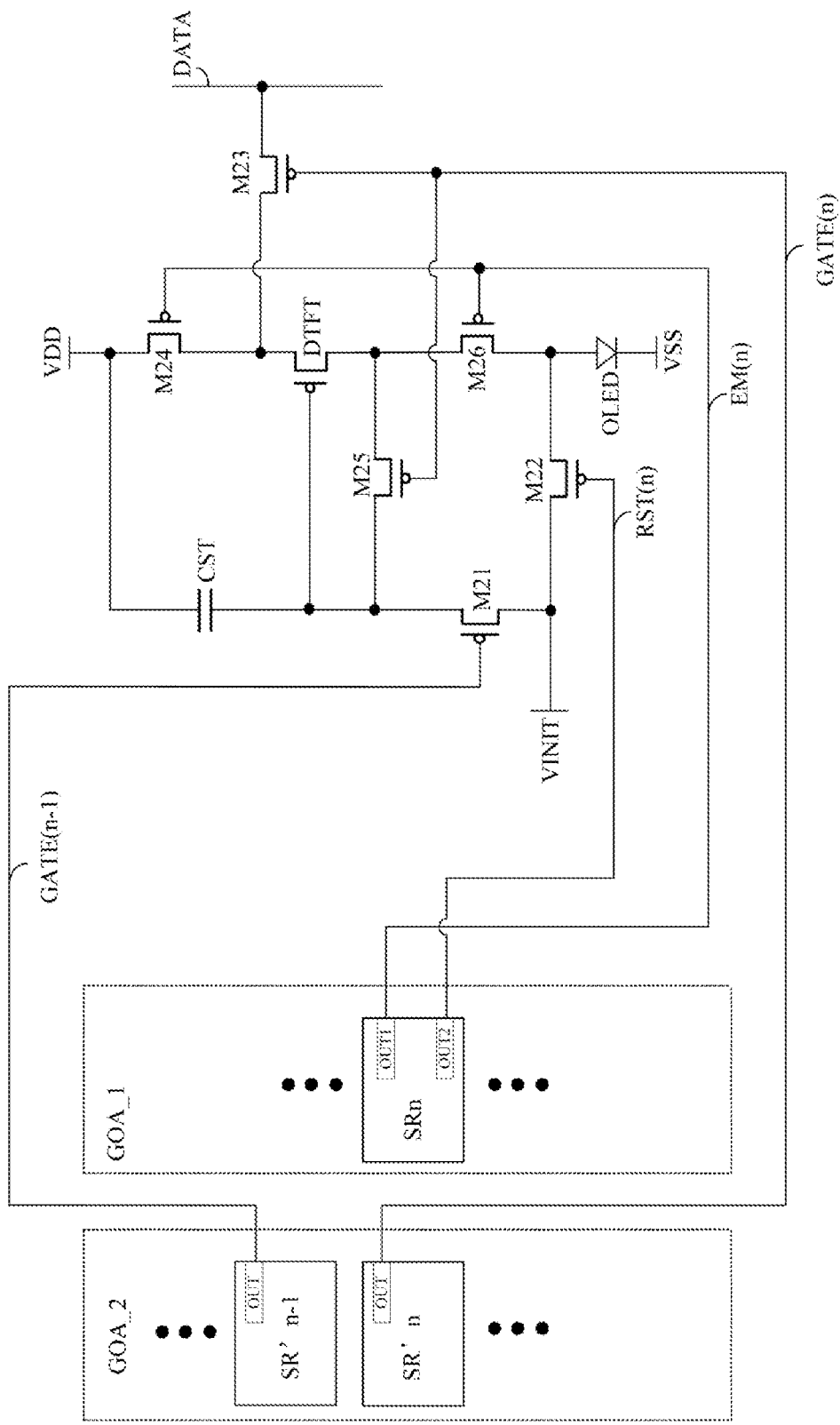
FIG. 18 is a schematic diagram illustrating a connection between a pixel unit and a driving circuit in a peripheral area according to an embodiment of the present disclosure.

FIG. 18 is a schematic diagram illustrating a connection between a pixel unit and a driving circuit in a peripheral area according to an embodiment of the present disclosure. As shown in FIG. 18, in some embodiments, for any pixel unit in the rows except the first row, a scanning control signal line coupled to the pixel unit is a scanning signal line configured for a previous one row of pixel units. In this case, the scanning signal lines can be multiplexed, and scanning control signal lines do not need to be additionally disposed, which is beneficial to reducing the wiring space.

For the pixel unit shown in FIG. 18, two driving circuits, i.e., a light emitting control driving circuit GOA_1 and a scan driving circuit GOA_2, are arranged in the peripheral area of the display substrate, wherein the light emitting control driving circuit GOA_1 is used for providing a light emitting control signal and a reset signal, and the scan driving circuit GOA_2 is used for providing a scanning signal.

For example, taking the pixel unit shown in FIG. 18 as the pixel unit in the $n^{th}$ row, the light emitting control signal line EM(n) configured for the pixel unit is coupled to the first signal output terminal OUT1 of the shift register SRn of the $n^{th}$ stage in the light emitting control driving circuit GOA_1, the reset signal line RST(n) configured for the pixel unit is coupled to the second signal output terminal OUT2 of the shift register SRn of the $n^{th}$ stage in the light emitting control driving circuit GOA_1, the scanning signal line GATE(n) configured for the pixel unit is coupled to the signal output terminal OUT of the shift register SR'n (the specific circuit structure is conventional in the art) of the $n^{th}$ stage in the scan driving circuit GOA_2, the scanning control signal line configured for the pixel unit is the scanning signal line GATE(n−1) in the $(n-1)^{th}$ row, and the scanning signal line GATE(n−1) is coupled to the signal output terminal OUT of the shift register SR'(n−1) of the $(n-1)^{th}$ stage in the scan driving circuit GOA_2.

In the embodiment of the present disclosure, since the reset signal and the light emitting control signal are output from a same driving circuit, synchronous output of the reset signal and the light emitting control signal can be ensured. In addition, the light emitting control signal is usually a Pulse Width Modulation (PWM) signal, so that the light emitting control signal has an output with multiple pulses within one frame display time. Since the reset signal and the light emitting control signal are synchronously output and have opposite phases in the present disclosure, the second reset sub-circuit 22 is turned on for multiple times within one frame display time to reset the light emitting device OLED for multiple times, thereby improving the service life of the light emitting device OLED, and reducing the luminance difference when different light emitting control signal pulses under the PWM control the light emitting device to emit light.

It should be noted that the case where the pixel circuit shown in FIGS. 17 and 18 include 7 transistors and 1 capacitor (also referred to as a 7T1C circuit) is only used as an example, and does not limit the technical solution of the present disclosure, and the technical solution of the present disclosure can also be applied to other pixel circuits.

It will be understood that the above embodiments are merely exemplary embodiments adopted to illustrate the principles of the present disclosure, and the present disclosure is not limited thereto. It will be apparent to one of ordinary skill in the art that various changes and modifications can be made without departing from the spirit and scope of the present disclosure, and these changes and modifications are to be considered within the scope of the present disclosure.

What is claimed is:

1. A shift register, comprising:
a first transistor having a control electrode coupled to a first clock signal line to receive a first clock signal, a first electrode coupled to a signal input terminal, and a second electrode coupled to a first node;
a second transistor having a control electrode coupled to the first node, a first electrode coupled to a second node, and a second electrode coupled to the first clock signal line to receive the first clock signal;
a third transistor having a control electrode coupled to the first clock signal line to receive the first clock signal, a first electrode coupled to a first power terminal, and a second electrode coupled to the second node;
a fourth transistor having a control electrode coupled to a second clock signal line to receive a second clock signal, a first electrode coupled to a second electrode of a fifth transistor, and a second electrode coupled to the first node;
the fifth transistor having a control electrode coupled to a third node and a first electrode coupled to a second power terminal;
a first capacitor having a first electrode coupled to a fourth node and a second electrode coupled to the second clock signal line, the first node being coupled to the fourth node;
an impedance transistor having a control electrode coupled to the first power terminal, a first electrode coupled to the second node, and a second electrode coupled to the third node;
a first output control circuit coupled to the third node, the fourth node and a first signal output terminal, and configured to output a first driving signal to the first signal output terminal in response to the control of signals at the third node and the fourth node; and
a second output control circuit coupled to at least the first signal output terminal and a second signal output terminal, and configured to output a second driving signal with a phase opposite to that of the first driving signal, to the second signal output terminal, according to the first driving signal output from the first signal output terminal,
wherein the second output control circuit comprises:
an eleventh transistor having a control electrode coupled to the fifth node, a first electrode coupled to the first power terminal, and a second electrode coupled to a seventh node;
a twelfth transistor having a control electrode coupled to the first signal output terminal, a first electrode coupled to the seventh node, and a second electrode coupled to the second power terminal;
a fourth capacitor having a first electrode coupled to the first clock signal line and a second electrode coupled to the seventh node;
a fourteenth transistor having a control electrode coupled to the seventh node, a first electrode coupled to the first power terminal, and a second electrode coupled to the second signal output terminal; and a fifteenth transistor having a control electrode coupled to the first signal output terminal, a first electrode coupled to the second signal output terminal, and a second electrode coupled to the second power terminal.

2. The shift register according to claim 1, wherein the first output control circuit comprises:
   a ninth transistor having a control electrode coupled to a fifth node, a first electrode coupled to the second power terminal, and a second electrode coupled to the first signal output terminal; and
   a third capacitor having a first electrode coupled to the fifth node and a second electrode coupled to the second power terminal.

3. The shift register according to claim 2, wherein the first output control circuit further comprises:
   a sixth transistor having a control electrode coupled to the third node, a first electrode coupled to the second clock signal line to receive the second clock signal, and a second electrode coupled to a sixth node;
   a seventh transistor having a control electrode coupled to the second clock signal line to receive the second clock signal, a first electrode coupled to the sixth node, and a second electrode coupled to the fifth node;
   an eighth transistor having a control electrode coupled to the first node, a first electrode coupled to the fifth node, and a second electrode coupled to the second power terminal;
   a tenth transistor having a control electrode coupled to the fourth node, a first electrode coupled to the first signal output terminal, a second electrode coupled to the first power terminal, the first node being coupled to the fourth node; and
   a second capacitor having a first electrode coupled to the third node and a second electrode coupled to the sixth node.

4. A driving circuit, comprising a plurality of shift registers arranged in cascade, wherein the plurality of shift registers each adopt the shift register according to claim 1;
   the signal input terminal of the shift register of a first stage is coupled to a frame start signal terminal; and
   the signal input terminal of each of the plurality of shift registers, except the shift register at the first stage, is coupled to the first signal output terminal of the shift register of a previous one stage.

5. A display substrate, comprising a display area and a peripheral area surrounding the display area, wherein a plurality of pixel units are in the display area, each of the plurality of pixel units is configured with a corresponding light emitting control signal line, a light emitting control driving circuit is in the peripheral area, the light emitting control driving circuit adopts the driving circuit according to claim 4, and the first signal output terminal of the shift register of each stage in the light emitting control driving circuit is coupled to the corresponding light emitting control signal line in the display area.

* * * * *